(12) United States Patent
Chun et al.

(10) Patent No.: US 12,520,546 B2
(45) Date of Patent: Jan. 6, 2026

(54) INTEGRATED CIRCUIT DEVICE

(71) Applicant: SAMSUNG ELECTRONICS CO., LTD., Suwon-si (KR)

(72) Inventors: Kyungbin Chun, Suwon-si (KR); Gyeom Kim, Suwon-si (KR); Dahye Kim, Suwon-si (KR); Youngkwang Kim, Suwon-si (KR); Jinbum Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 401 days.

(21) Appl. No.: 18/119,037

(22) Filed: Mar. 8, 2023

(65) Prior Publication Data
US 2024/0038842 A1    Feb. 1, 2024

(30) Foreign Application Priority Data

Aug. 1, 2022  (KR) .................. 10-2022-0095692

(51) Int. Cl.
| | |
|---|---|
| H01L 29/08 | (2006.01) |
| H01L 29/06 | (2006.01) |
| H01L 29/423 | (2006.01) |
| H01L 29/66 | (2006.01) |
| H01L 29/775 | (2006.01) |
| H10D 30/01 | (2025.01) |
| H10D 30/43 | (2025.01) |
| H10D 30/67 | (2025.01) |

(Continued)

(52) U.S. Cl.
CPC ......... *H10D 62/151* (2025.01); *H10D 30/014* (2025.01); *H10D 30/43* (2025.01); *H10D 30/6735* (2025.01); *H10D 62/121* (2025.01); *H10D 64/017* (2025.01); *H10D 64/018* (2025.01)

(58) Field of Classification Search
CPC .. H10D 30/014; H10D 30/43; H10D 30/6219; H10D 30/6713; H10D 30/6735; H10D 30/797; H10D 62/021; H10D 62/118; H10D 62/119; H10D 62/121; H10D 62/149; H10D 62/151; H10D 64/015; H10D 64/017; H10D 64/018; H10D 64/021; H10D 84/013; H10D 84/017
See application file for complete search history.

(56) References Cited

U.S. PATENT DOCUMENTS 9,881,993 B2   1/2018  Ching et al.
10,872,983 B2  12/2020 Yang et al.
(Continued)

*Primary Examiner* — David C Spalla
(74) *Attorney, Agent, or Firm* — Sughrue Mion, PLLC

(57) ABSTRACT

An integrated circuit (IC) device includes a fin-type active region on a substrate, a pair of nanosheets on the fin-type active region, a gate line surrounding the pair of nanosheets, the gate line including a sub-gate portion between the pair of nanosheets, a source/drain region contacting the pair of nanosheets, and a gate dielectric film between the gate line and the pair of nanosheets and between the gate line and the source/drain region, wherein the source/drain region includes a first blocking layer between the pair of nanosheets, the first blocking layer including an edge barrier enhancing portion facing the sub-gate portion, and a second blocking layer, wherein the first blocking layer includes a portion that intermittently extends in the vertical direction.

19 Claims, 48 Drawing Sheets

(51) Int. Cl.
    *H10D 62/10*     (2025.01)
    *H10D 62/13*     (2025.01)
    *H10D 64/01*     (2025.01)

(56) References Cited

U.S. PATENT DOCUMENTS

| | | | |
|---|---|---|---|
| 10,923,598 | B2 | 2/2021 | Wang et al. |
| 11,227,917 | B1 * | 1/2022 | Chung ................ H10D 84/013 |
| 2022/0037494 | A1 | 2/2022 | Park et al. |
| 2022/0059654 | A1 | 2/2022 | Kim et al. |
| 2022/0069134 | A1 | 3/2022 | Kim et al. |
| 2022/0140078 | A1 | 5/2022 | Chung et al. |
| 2022/0367622 | A1 * | 11/2022 | Lin .................... H10D 30/6713 |
| 2023/0052084 | A1 * | 2/2023 | Cheng ................ H10D 62/021 |
| 2023/0063612 | A1 * | 3/2023 | Lin .................... H10D 30/6757 |
| 2023/0378298 | A1 * | 11/2023 | Li ........................ H10D 64/256 |
| 2023/0411456 | A1 * | 12/2023 | More ................ H10D 30/6735 |

\* cited by examiner

LN1 – LN1'

LN1 – LN1'

LN1 - LN1'

INTEGRATED CIRCUIT DEVICE

CROSS-REFERENCE TO RELATED APPLICATION

This application is based on and claims priority under 35 U.S.C. § 119 to Korean Patent Application No. 10-2022-0095692, filed on Aug. 1, 2022, in the Korean Intellectual Property Office, the disclosure of which being incorporated by reference herein in its entirety.

BACKGROUND

The present disclosure relates to an integrated circuit (IC) device, and more particularly, to an IC device including a fin field-effect transistor (FinFET).

As the downscaling of IC devices has rapidly progressed, it has become necessary to ensure not only a high operating speed but also high operating accuracy in IC devices. In addition, as the integration density of IC devices has increased and the sizes of IC devices have been reduced, the likelihood of process failures may increase during the manufacture of nanosheet field-effect transistors (FETs). Accordingly, it has become necessary to develop IC devices having new structures capable of eliminating the likelihood of process failures and improving the performance and reliability of FETs having fin-type active regions.

SUMMARY

It is an aspect to provide an integrated circuit (IC) device in which a nanosheet field-effect transistor (FET) may provide stable performance and improved reliability.

According to an aspect of one or more embodiments, there is provided an integrated circuit device comprising a fin-type active region extending long in a first lateral direction on a substrate; a pair of nanosheets on the fin-type active region, the pair of nanosheets overlapping each other in a vertical direction; a gate line surrounding the pair of nanosheets on the fin-type active region, the gate line comprising a sub-gate portion between the pair of nanosheets; a source/drain region adjacent to the gate line on the fin-type active region, the source/drain region being in contact with the pair of nanosheets; and a gate dielectric film between the gate line and the pair of nanosheets and between the gate line and the source/drain region. The source/drain region comprises a first blocking layer between the pair of nanosheets, the first blocking layer comprising an edge barrier enhancing portion facing the sub-gate portion with the gate dielectric film therebetween and a portion that intermittently extends in the vertical direction; and a second blocking layer comprising a portion that is apart from the sub-gate portion with the first blocking layer therebetween.

According to another aspect of one or more embodiments, there is provided an integrated circuit device comprising a fin-type active region extending long in a first lateral direction on a substrate; a plurality of nanosheets facing a fin top surface of the fin-type active region at a position apart from the fin top surface of the fin-type active region, the plurality of nanosheets being at different vertical distances from the fin top surface of the fin-type active region; a gate line surrounding each of the plurality of nanosheets on the fin-type active region, the gate line comprising a sub-gate portion between a pair of adjacent nanosheets of the plurality of nanosheets, the gate line extending long in a second lateral direction, wherein the second lateral direction intersects with the first lateral direction; an outer insulating spacer covering a sidewall of the gate line; and a source/drain region facing the plurality of nanosheets in the first lateral direction. The source/drain region comprises a first blocking layer comprising portions respectively in contact with the plurality of nanosheets and a portion in contact with the fin-type active region, the first blocking layer comprising an edge barrier enhancing portion having a greater width in the first lateral direction at a position adjacent to the outer insulating spacer than other portions of the first blocking layer, the edge barrier enhancing portion facing the sub-gate portion between the pair of adjacent nanosheets; and a second blocking layer comprising a portion that is apart from the sub-gate portion with the first blocking layer therebetween, wherein the first blocking layer comprises a portion that intermittently extends in a vertical direction.

According to yet another aspect of one or more embodiments, there is provided an integrated circuit device comprising a fin-type active region extending long in a first lateral direction on a substrate; a pair of nanosheet stacks facing a fin top surface of the fin-type active region in a vertical direction at a position apart from the fin top surface of the fin-type active region, each nanosheet stack comprising a plurality of nanosheets at different vertical distances from the fin top surface of the fin-type active region; a pair of gate lines respectively on the pair of nanosheet stacks on the fin-type active region, each gate line comprising a sub-gate portion between a pair of adjacent nanosheets; a plurality of outer insulating spacers covering sidewalls of each of the pair of gate lines; and a source/drain region on the fin-type active region between the pair of nanosheet stacks, the source/drain region being in contact with each of the pair of nanosheet stacks and comprising a $Si_{1-x}Ge_x$ layer (here, $x \neq 0$) doped with boron. The source/drain region comprises a first blocking layer in contact with the plurality of nanosheets of each of the pair of nanosheet stacks, the first blocking layer comprising an edge barrier enhancing portion having a greater width in the first lateral direction at a position adjacent to the plurality of outer insulating spacers than other portions of the first blocking layer, the edge barrier enhancing portion facing the sub-gate portion between the pair of adjacent nanosheets; and a second blocking layer comprising a portion that is apart from the sub-gate portion with the first blocking layer therebetween, wherein the first blocking layer comprises a portion that intermittently extends in the vertical direction.

BRIEF DESCRIPTION OF THE DRAWINGS

Various embodiments will be more clearly understood from the following detailed description taken in conjunction with the accompanying drawings, in which:

FIGS. 11 to 26 are diagrams of a process sequence of a method of manufacturing an IC device, according to some embodiments, wherein FIGS. 11 to 13, 14A, 15A, 16A, 17A, 18A, 19A, and 20 to 26 are cross-sectional views of a portion corresponding to the cross-section taken along line X1-X1' of FIG. 1, according to a process sequence, FIGS. 27A to 28C are diagrams of a process sequence of a method of manufacturing an IC device, according to some embodiments, wherein FIGS. 27A and 28A are cross-sectional views of a portion corresponding to the cross-section taken along line X1-X1' of FIG. 1, according to a process sequence.

DETAILED DESCRIPTION

Figure 1:
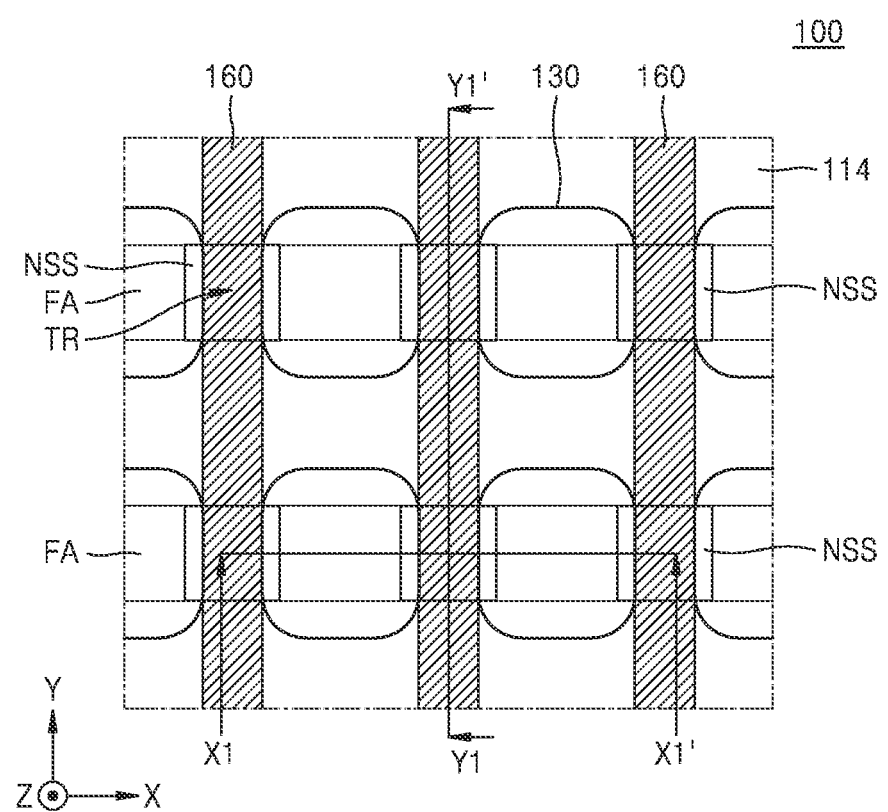
FIG. 1 is a plan layout diagram of some components of an integrated circuit (IC) device according to some embodiments.

Hereinafter, various embodiments will be described in detail with reference to the accompanying drawings. The same reference numerals are used to denote the same elements in the drawings, and repeated descriptions thereof are omitted for conciseness.

FIG. 1 is a plan layout diagram of an integrated circuit (IC) device 100 according to some embodiments.

Figure 2A:
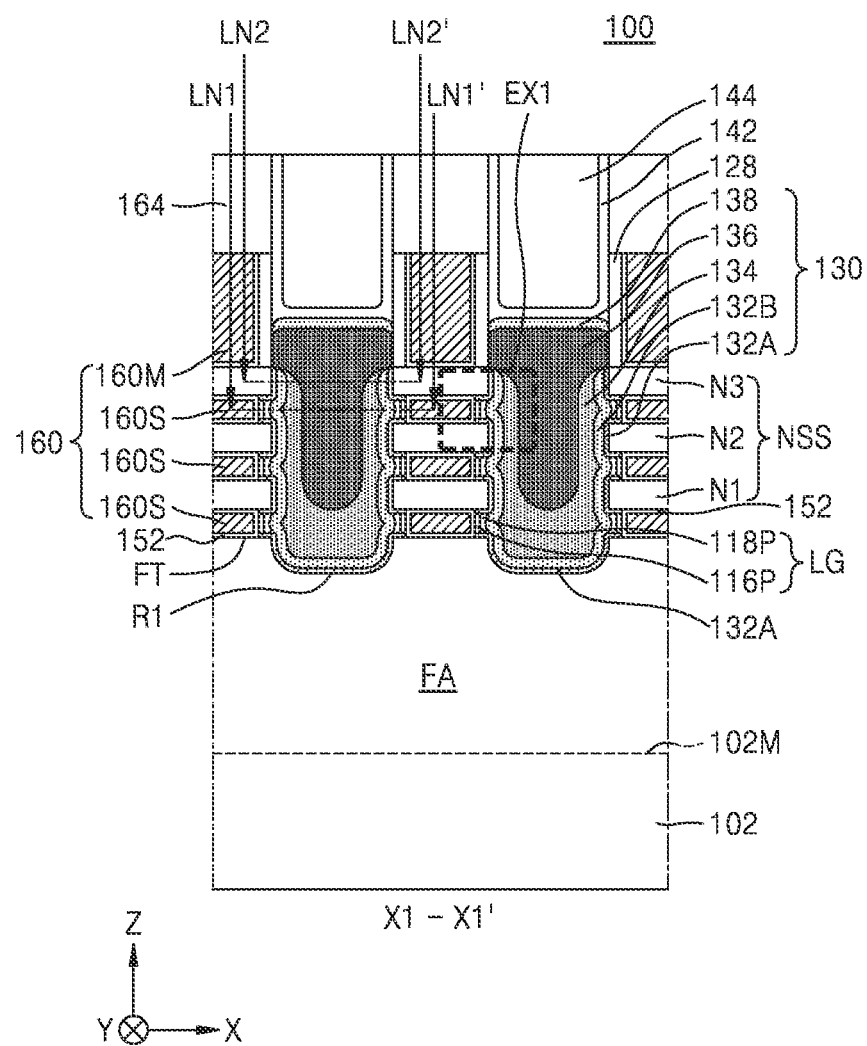
FIG. 2A is a cross-sectional view taken along line X1-X1' of FIG. 1.
Figure 2B:
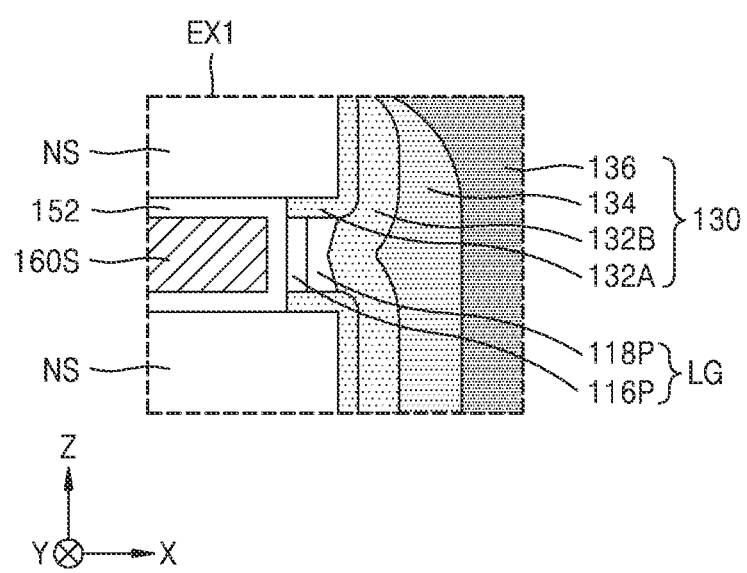
FIG. 2B is an enlarged cross-sectional view of a local region "EX1" of FIG. 2A.
Figure 2C:
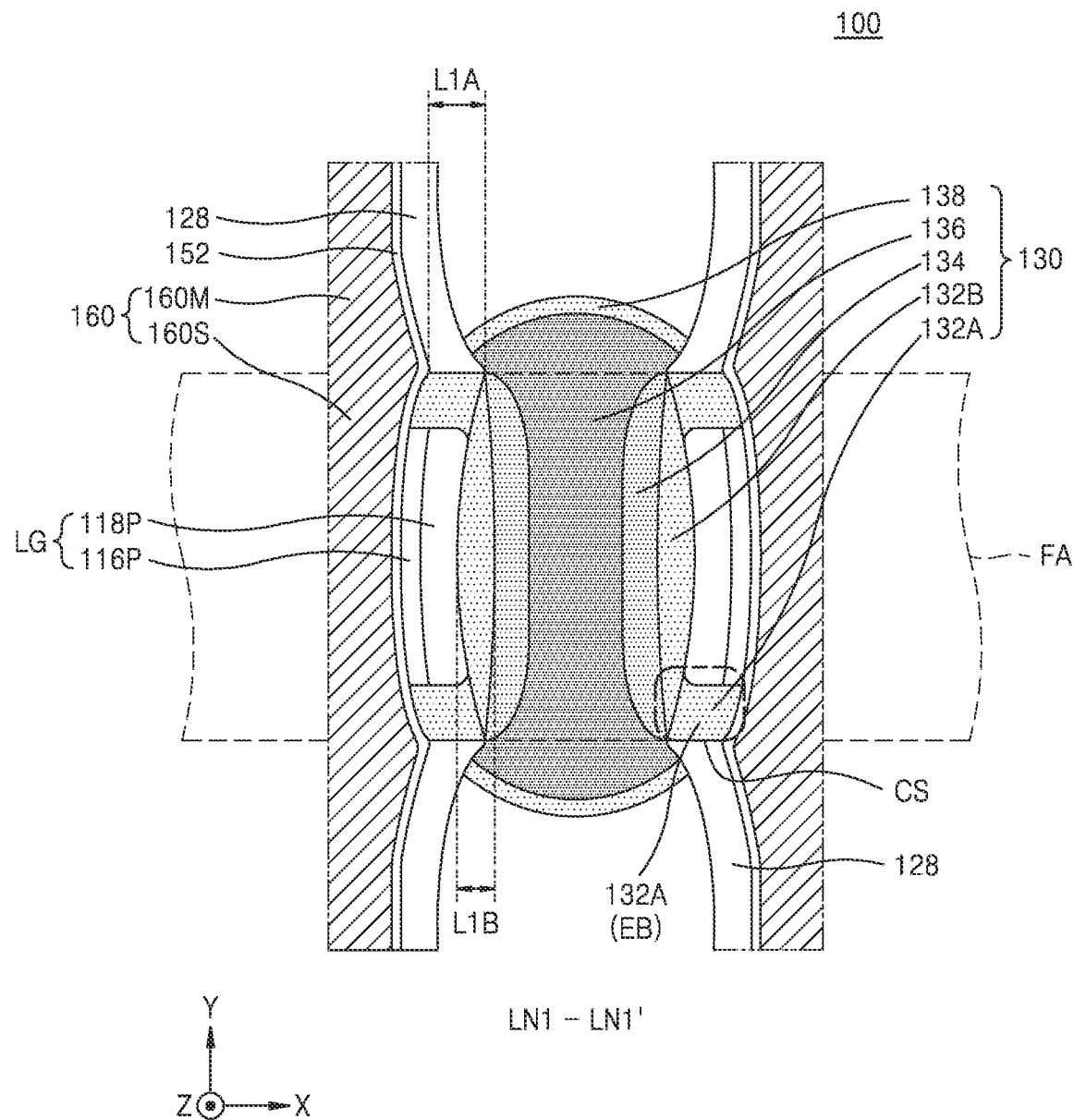
FIG. 2C is an enlarged plan view of some components at a vertical level according to a cross-section taken along line LN1-LN1' of FIG. 2A.
Figure 2D:
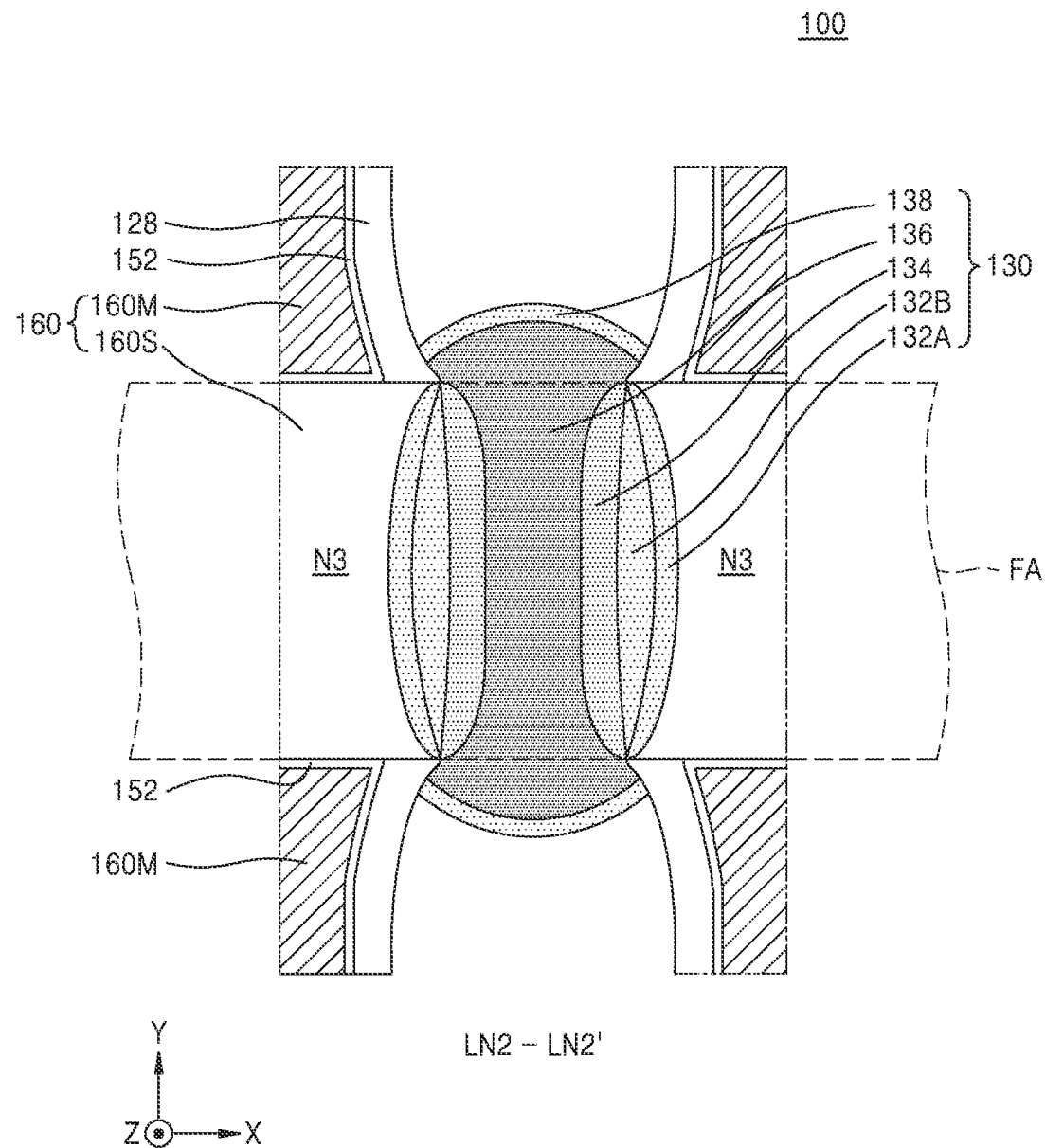
FIG. 2D is an enlarged plan view of some components at a vertical level according to a cross-section taken along line LN2-LN2' of FIG. 2A.
Figure 2E:
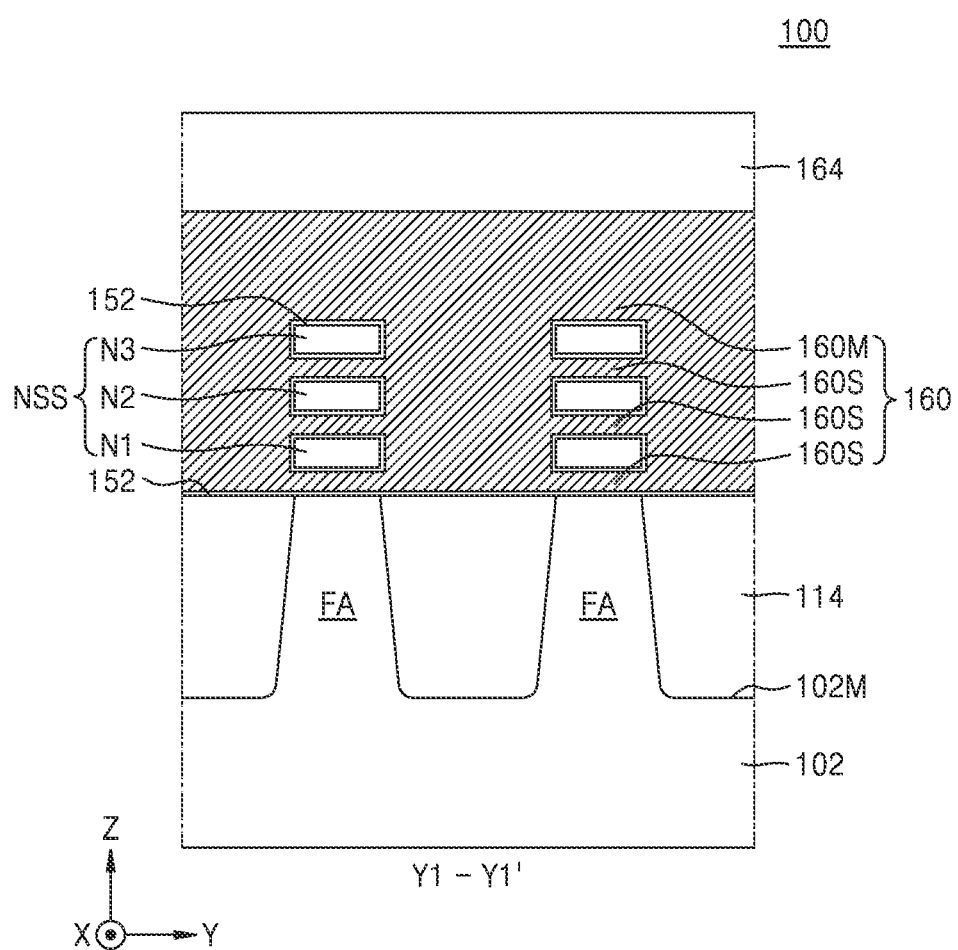
FIG. 2E is a cross-sectional view taken along line Y1-Y1' of FIG. 1.

FIG. 1 is a plan layout diagram of some components of the IC device 100 according to some embodiments. FIG. 2A is a cross-sectional view taken along line X1-X1' of FIG. 1. FIG. 2B is an enlarged cross-sectional view of a local region "EX1" of FIG. 2A. FIG. 2C is an enlarged plan view of some components at a vertical level according to a cross-section taken along line LN1-LN1' of FIG. 2A. FIG. 2D is an enlarged plan view of some components at a vertical level LV1 according to a cross-section taken along line LN2-LN2' of FIG. 2A. FIG. 2E is a cross-sectional view taken along line Y1-Y1' of FIG. 1. The IC device 100 including a field-effect transistor (FET) TR having a gate-all-around structure including an active region of a nanowire or nanosheet type and a gate surrounding the active region will now be described with reference to FIGS. 1 and 2A to 2E.

Referring to FIGS. 1 and 2A to 2E, the IC device 100 may include a plurality of fin-type active regions FA and a plurality of nanosheet stacks NSS. The plurality of fin-type active regions FA may protrude upward from a substrate 102 in a vertical direction (Z direction) and extend long in a first lateral direction (X direction). The plurality of nanosheet stacks NSS may be on the plurality of fin-type active regions FA. As used herein, the term "nanosheet" refers to a conductive structure having a cross-section that is substantially perpendicular to a direction in which current flows. The nanosheet may be interpreted as including a nanowire.

The substrate 102 may include a semiconductor, such as silicon (Si) or germanium (Ge), or a compound semiconductor, such as silicon germanium (SiGe), silicon carbide (SiC), gallium arsenide (GaAs), indium arsenide (InAs), indium gallium arsenide (InGaAs), or indium phosphide (InP). As used herein, each of the terms "SiGe," "SiC," "GaAs," "InAs," "InGaAs," and "InP" refers to a material including elements included therein, without referring to a chemical formula representing a stoichiometric relationship.

A device isolation film (see 114 in FIGS. 1 and 2E) covering both sidewalls of each of the plurality of fin-type active regions FA may be on the substrate 102. The device isolation film 114 may include an oxide film, a nitride film, or a combination thereof.

A plurality of gate lines 160 may be on the plurality of fin-type active regions FA. Each of the plurality of gate lines 160 may extend in a second lateral direction (Y direction), which intersects with the first lateral direction (X direction).

The plurality of nanosheet stacks NSS may be respectively on fin top surfaces FT of the plurality of fin-type active regions FA in regions where the plurality of fin-type active regions FA intersect with the plurality of gate lines 160. Each of the plurality of nanosheet stacks NSS may include at least one nanosheet, which is apart from the fin top surface FT of the fin-type active region FA in the vertical direction (Z direction) and faces the fin top surface FT of the fin-type active region FA.

As shown in FIG. 2A, each of the plurality of nanosheet stacks NSS may include a first nanosheet N1, a second nanosheet N2, and a third nanosheet N3, which overlap each other in the vertical direction (Z direction) on the fin-type active region FA. The first nanosheet N1, the second nanosheet N2, and the third nanosheet N3 may be at different vertical distances (Z-directional distances) from the fin top surface FT of the fin-type active region FA.

FIG. 1 illustrates a case in which the nanosheet stack NSS approximately has a rectangular planar shape, without being limited thereto. The nanosheet stack NSS may have various planar shapes according to a planar shape of each of the fin-type active region FA and the gate line 160. The present example pertains to a configuration in which the plurality of nanosheet stacks NSS and the plurality of gate lines 160 are formed on one fin-type active region FA, and the plurality of nanosheet stacks NSS are arranged in a line in the first lateral direction (X direction) on one fin-type active region FA. However, according to some embodiments, the numbers of nanosheet stacks NSS and gate lines 160 on one fin-type active region FA are not specifically limited to those illustrated.

Each of the first to third nanosheets N1, N2, and N3 in the nanosheet stack NSS may serve as a channel region. In some embodiments, each of the first to third nanosheets N1, N2, and N3 may have a thickness in a range of about 4 nm to about 6 nm, without being limited thereto. Here, the thickness of each of the first to third nanosheets N1, N2, and N3 refers to a size of each of the first to third nanosheets N1, N2, and N3 in the vertical direction (Z direction). In some embodiments, the first to third nanosheets N1, N2, and N3 may have substantially the same thickness in the vertical direction (Z direction). In other embodiments, at least some of the first to third nanosheets N1, N2, and N3 may have different thicknesses in the vertical direction (Z direction).

As shown in FIG. 2A, the first to third nanosheets N1, N2, and N3 included in one nanosheet stack NSS may substantially have the same size in the first lateral direction (X direction). In other embodiments, differently from those shown in FIG. 2A, at least some of the first to third nanosheets N1, N2, and N3 included in one nanosheet stack NSS may have different sizes in the first lateral direction (X direction).

As shown in FIGS. 2A to 2E, each of the plurality of gate lines 160 may include a main gate portion 160M and a plurality of sub-gate portions 160S. The main gate portion 160M may extend long in the second lateral direction (Y direction) while covering a top surface of the nanosheet stack NSS. The plurality of sub-gate portions 160S may be integrally connected to the main gate portion 160M and respectively arranged between the first to third nanosheets N1, N2, and N3 and between the first nanosheet N1 and the fin-type active region FA. In the vertical direction (Z direction), a thickness of each of the plurality of sub-gate portions 160S may be less than a thickness of the main gate portion 160M.

Each of the gate lines 160 may include a metal, a metal nitride, a metal carbide, or a combination thereof. The metal may be one of titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), or palladium (Pd). The metal nitride may be one or titanium nitride (TiN) or tantalum nitride (TaN). The metal carbide may include titanium aluminum carbide (TiAlC). However, a material included in the plurality of gate lines 160 is not limited to the examples described above.

A gate dielectric film 152 may be between the nanosheet stack NSS and the gate line 160. In some embodiments, the gate dielectric film 152 may have a stack structure of an interface dielectric film and a high-k dielectric film. The interface dielectric film may include a low-k dielectric material film (e.g., a silicon oxide film, a silicon oxynitride film, or a combination thereof), which has a dielectric constant of about 9 or less. In some embodiments, the interface dielectric film may be omitted. The high-k dielectric film may include a material having a higher dielectric constant than a silicon oxide film. For example, the high-k dielectric film may have a dielectric constant of about 10 to about 25. The high-k dielectric film may include hafnium oxide, without being limited thereto.

As shown in FIG. 2A, a pair of source/drain regions 130 may be on sides of the gate line 160 with one gate line 160 therebetween on the fin-type active region FA. In other words, two source/drain regions 130 may be provided correspondingly to each gate line 160, with one source/drain region 130 of the two source/drain regions 130 on each side of the corresponding gate line 160 as illustrated in FIG. 2A. Each of a plurality of source/drain regions 130 may be on the fin-type active region FA between a pair of nanosheet stacks NSS, which are adjacent to each other, and a pair of gate lines 160, which are adjacent to each other. The source/drain region 130 may be in contact with a sidewall of the nanosheet stack NSS, which is surrounded by the gate line 160 adjacent thereto. The source/drain region 130 may be in contact with a sidewall of each of the first to third nanosheets N1, N2, and N3 included in the nanosheet stack NSS.

Both sidewalls of each of the plurality of gate lines 160 may be covered by outer insulating spacers 128. The outer insulating spacers 128 may cover both sidewalls of the main gate portion 160M on the top surface of each of the plurality of nanosheet stacks NSS. The outer insulating spacer 128 may be apart from the gate line 160 with the gate dielectric film 152 therebetween. The outer insulating spacer 128 may include silicon nitride, silicon oxide, silicon carbonitride (SiCN), silicon boron nitride (SiBN), silicon oxynitride (SiON), silicon oxycarbonitride (SiOCN), silicon boron carbonitride (SiBCN), silicon oxycarbide (SiOC), or a combination thereof. As used herein, each of the terms "SiCN," "SiBN," "SiON," "SiOCN," "SiBCN," and "SiOC" refers to a material including elements included therein, without referring to a chemical formula representing a stoichiometric relationship.

As shown in FIG. 2A, each of the plurality of source/drain regions 130 may include a portion, which overlaps the outer insulating spacer 128 in the vertical direction (Z direction). In some embodiments, each of the plurality of source/drain regions 130 may not include a portion that overlaps the main gate portion 160M or the sub-gate portion 160S in the vertical direction (Z direction).

Both sidewalls of each of the plurality of sub-gate portions 160S may be apart from the source/drain region 130 with the gate dielectric film 152 therebetween. The gate dielectric film 152 may be between the sub-gate portion 160S included in the gate line 160 and each of the first to third nanosheets N1, N2, and N3 and between the sub-gate portion 160S included in the gate line 160 and the source/drain region 130.

As shown in FIG. 2A, a plurality of recesses R1 may be formed in the fin-type active region FA. A lowermost surface of each of the plurality of recesses R1 may be at a lower vertical level than the fin top surface FT of the fin-type active region FA. As used herein, the term "vertical level" refers to a height from a main surface 102M of the substrate 102 in a vertical direction (Z direction or –Z direction).

As shown in FIG. 2A, a plurality of source/drain regions 130 may be respectively inside the plurality of recesses R1. Each of the plurality of source/drain regions 130 may be adjacent to at least one gate line 160 of the plurality of gate lines 160. Each of the plurality of source/drain regions 130 may have surfaces facing the first to third nanosheets N1, N2, and N3 included in the nanosheet stack NSS adjacent thereto. Each of the plurality of source/drain regions 130 may be in contact with the first to third nanosheets N1, N2, and N3 included in the nanosheet stack NSS adjacent thereto.

As shown in FIGS. 2A, 2C, and 2D, each of the plurality of source/drain regions 130 may include a first blocking layer 132A, a second blocking layer 132B, a buffer layer 134, a main body layer 136, and a capping layer 138, which are sequentially stacked on a bottom surface of the recess R1 in a vertical direction (Z direction). To facilitate the understanding of relative positions and shapes of components of the IC device 100, a planar shape of the fin-type active region FA is illustrated with a dashed line in each of FIGS. 2C and 2D.

The first blocking layer 132A may include portions, which are between a pair of nanosheets (i.e., two adjacent nanosheets) that overlap each other in the vertical direction (Z direction) and are most adjacent to each other, from among the first to third nanosheets N1, N2, and N3 included in the nanosheet stack NSS adjacent to the first blocking layer 132A. The portions of the first blocking layer 132A, which are between the pair of nanosheets, may include at least one edge barrier enhancing portion EB. For example, as shown in FIG. 2C, the first blocking layer 132A included in one source/drain region 130 may include four edge barrier enhancing portions EB.

As shown in FIGS. 2A, 2B, and 2C, in the source/drain region 130, the first blocking layer 132A may include portions, which are in contact with the gate dielectric film 152 between a pair of nanosheets that overlap each other in the vertical direction (Z direction) and are most adjacent to each other, from among the first to third nanosheets N1, N2, and N3. As shown in FIG. 2C, the edge barrier enhancing portion EB included in the first blocking layer 132A may include a portion, which faces the sub-gate portion 160S of the gate line 160 with the gate dielectric film 152 therebetween.

As shown in FIGS. 2A, 2B, and 2C, the second blocking layer 132B may include a portion that is apart from the sub-gate portion 160S with the first blocking layer 132A therebetween. As shown in FIGS. 2A and 2B, the first blocking layer 132A may include a portion that intermittently extends in the vertical direction (Z direction) not to cover a portion of the sub-gate portion 160S. Accordingly, in some regions located in the vertical direction (Z direction), the first blocking layer 132A may not be between the sub-gate portion 160S and the second blocking layer 132B.

The buffer layer 134 may have a sidewall and a bottom surface in contact with the second blocking layer 132B. The main body layer 136 may have a sidewall and a bottom surface in contact with the buffer layer 134. The capping layer 138 may be in contact with a surface of the main body layer 136.

As shown in FIGS. 2A and 2B, between the pair of nanosheets that overlap each other in the vertical direction (Z direction) and are adjacent to each other, the edge barrier enhancing portion EB of the first blocking layer 132A may include a portion in contact with the gate dielectric film 152. As shown in FIG. 2C, in a plan view (i.e., X-Y plane) parallel to the main surface 102M of the substrate 102, a width L1A of the edge barrier enhancing portion EB of the first blocking layer 132A may be greater than a width L1B of the second blocking layer 132B in a first lateral direction (X direction). In some embodiments, a maximum width of the edge barrier enhancing portion EB of the first blocking layer 132A may be greater than a maximum width of the second blocking layer 132B in the first lateral direction (X direction). In some embodiments, the width L1A of the edge barrier enhancing portion EB may be in a range of about 5 nm to about 7 nm, and the width L1B of the second blocking layer 132B may be in a range of about 2 nm to about 3 nm, without being limited thereto.

As shown in FIG. 2C, in the plan view (i.e., X-Y plane) parallel to the main surface 102M of the substrate 102, the edge barrier enhancing portion EB of the first blocking layer 132A may include a portion that protrudes more toward the sub-gate portion 160S of the gate line 160 than other portions of the source/drain region 130 in the first lateral direction (X direction).

As shown in FIG. 2C, the edge barrier enhancing portion EB of the first blocking layer 132A may fill a corner region CS (or a region illustrated with a dashed line in FIG. 2C), which is defined between a portion of the gate dielectric film 152 covering the sidewall of the sub-gate portion 160S and the outer insulating spacer 128. In the corner region CS, the edge barrier enhancing portion EB may be in contact with each of the gate dielectric film 152 and the outer insulating spacer 128.

As shown in FIG. 2A, in the source/drain region 130, the main body layer 136 may have a top surface at a higher vertical level (i.e., in the Z direction) than an uppermost surface of each of the plurality of nanosheet stacks NSS. The capping layer 138 may cover the top surface of the main body layer 136.

In the source/drain region 130, each of the first blocking layer 132A, the second blocking layer 132B, the buffer layer 134, and the main body layer 136 may include a $Si_{1-x}Ge_x$ layer (here, x≠0) doped with a p-type dopant. Each of the buffer layer 134 and the main body layer 136 may have a germanium (Ge) content higher than a Ge content of each of the first blocking layer 132A and the second blocking layer 132B. A Ge content of the main body layer 136 may be higher than a Ge content of the buffer layer 134.

In some embodiments, in the source/drain region 130, a first Ge content of the first blocking layer 132A may be equal to a second Ge content of the second blocking layer 132B. In other embodiments, the second Ge content may be higher than the first Ge content and may be lower than the Ge content of the buffer layer 134. The above-described configuration may be advantageous for preventing lattice mismatch defects due to a large difference in lattice constant between the first blocking layer 132A and the buffer layer 134 in the source/drain region 130.

In some embodiments, the p-type dopant in the source/drain region 130 may include boron (B), gallium (Ga), carbon (C), or a combination thereof, without being limited thereto.

The capping layer 138 may include an undoped Si layer, a Si layer doped with a p-type dopant, or a SiGe layer having a lower Ge content than the main body layer 136. In some embodiments, the capping layer 138 may not include germanium (Ge). For example, the capping layer 138 may include an undoped Si layer. In other embodiments, the capping layer 138 may include a Si layer doped with boron or a SiGe layer doped with boron. In yet other embodiments, the capping layer 138 may be omitted.

In some embodiments, each of the first blocking layer 132A and the second blocking layer 132B may include a $Si_{1-x}Ge_x$ layer (here, $0.01 \le x \le 0.20$) doped with boron, the buffer layer 134 may include a $Si_{1-x}Ge_x$ layer (here, $0.40 \le x \le 0.45$) doped with boron, and the main body layer 136 may include a $Si_{1-x}Ge_x$ layer (here, $0.45 < x \le 0.70$) doped with boron, without being limited thereto. For example, a Ge content of the buffer layer 134 may be in a range of about 40 atomic percent (at %) to about 45 at %, and a Ge content of the main body layer 136 may be more than about 45 at % and less than or equal to about 60 at %, without being limited thereto.

As shown in FIGS. 2A, 2B, and 2C, the IC device 100 may further include a local insulating guide LG between a pair of nanosheets, which overlap each other in the vertical direction (Z direction) and are most adjacent to each other, from among the first to third nanosheets N1, N2, and N3 included in the nanosheet stack NSS.

The local insulating guide LG may be in contact with the gate dielectric film 152 between the pair of nanosheets, which are selected from the first to third nanosheets N1, N2, and N3. The second blocking layer 132B may be apart from the gate dielectric film 152 with the local insulating guide LG therebetween between the pair of nanosheets. Between the pair of nanosheets, both ends of the local insulating guide LG in the second lateral direction (Y direction) may be each in contact with the edge bather enhancing portion EB. The local insulating guide LG may include a portion in contact with the second blocking layer 132B. Between the pair of nanosheets of the first to third nanosheets N1, N2, and N3, the gate dielectric film 152 may extend to be between the sub-gate portion 160S and the local insulating guide LG and between the sub-gate portion 160S and the edge barrier enhancing portion EB.

In some embodiments, the local insulating guide LG may include a first insulating pattern 116P and a second insulating pattern 118P, which are sequentially stacked on the gate dielectric film 152 in the first lateral direction (X direction) between the pair of nanosheets of the first nanosheet N1, the second nanosheet N2, and the third nanosheet N3. The first insulating pattern 116P and the second insulating pattern 118P may include different materials from each other. In some embodiments, the local insulating guide LG may include a silicon oxide film, a silicon nitride film, or a combination thereof. For example, the first insulating pattern 116P may include a silicon nitride film, and the second insulating pattern 118P may include a silicon oxide film, without being limited thereto.

As shown in FIG. 1, on the substrate 102, a plurality of FETs TR may be formed at portions where the plurality of fin-type active regions FA intersect with the plurality of gate lines 160. The plurality of FETs TR may constitute a logic circuit or a memory device.

As shown in FIG. 2A, a top surface of each of the gate dielectric film 152, the gate line 160, and the outer insulating spacer 128 may be covered by a capping insulating pattern 164. The capping insulating pattern 164 may include a silicon nitride film.

On the substrate 102, a plurality of outer insulating spacers 128 and the plurality of source/drain regions 130 may be covered by an insulating liner 142. The insulating liner 142 may include silicon nitride (SiN), silicon oxide (SiO), SiCN, SiBN, SiON, SiOCN, SiBCN, SiOC, or a combination thereof. In some embodiments, the insulating liner 142 may be omitted. An inter-gate dielectric film 144 may be on the insulating liner 142. The inter-gate dielectric film 144 may include silicon nitride film, silicon oxide film, SiON, SiOCN, or a combination thereof. When the insulating liner 142 is omitted, the inter-gate dielectric film 144 may be in contact with the plurality of source/drain regions 130.

In the IC device 100 described with reference to FIGS. 1 and 2A to 2E, the first blocking layer 132A on an outermost side of the plurality of source/drain regions 130 may include an edge barrier enhancing portion EB adjacent to a portion of the sub-gate portion 160S of the gate line 160, which is adjacent to the outer insulating spacer 128. The edge barrier enhancing portion EB may be in the corner region CS (or the region illustrated with the dashed line in FIG. 2C), which is defined between a portion of the gate dielectric film 152 covering the sidewall of the sub-gate portion 160S and the outer insulating spacer 128. The edge barrier enhancing portion EB may have the width L1A, which is greater than widths of other portions of the first blocking layer 132A in the first lateral direction (X direction).

According to some embodiments, in an initial operation of the process of forming the source/drain region 130, the first blocking layer 132A including the edge barrier enhancing portion EB filling the corner region CS adjacent to the outer insulating spacer 128 may be previously formed. Accordingly, during the formation of the source/drain region 130, a facet surface may be prevented from being formed in the corner region CS, which is adjacent to the outer insulating spacer 128. As a result, a problem that the corner region CS or some regions adjacent thereto are not filled with the source/drain region 130 due to the facet surface may be prevented. Therefore, during the manufacture of the IC device 100, undesired attacks from the outside upon the source/drain region 130 may be prevented, and the occurrence of failures, such as a short circuit between the source/drain region 130 and the gate line 160 adjacent thereto, in the IC device 100 may be prevented.

In some embodiments, the source/drain region 130 may further include the second blocking layer 132B covering the edge barrier enhancing portion EB in a region adjacent to the corner region CS. The second blocking layer 132B may supplement and/or enhance the above-described effects of the first blocking layer 132A including the edge barrier enhancing portion EB. In some embodiments, the second blocking layer 132B may be formed such that a Ge content of the second blocking layer 132B is higher than a Ge content of the first blocking layer 132A and lower than a Ge content of the buffer layer 134, and thus, lattice mismatch defects due to a sharp difference in lattice constant between the first blocking layer 132A and the buffer layer 134 in the source/drain region 130 may be prevented. Accordingly, the reliability of the IC device 100 may be improved.

Figure 3:
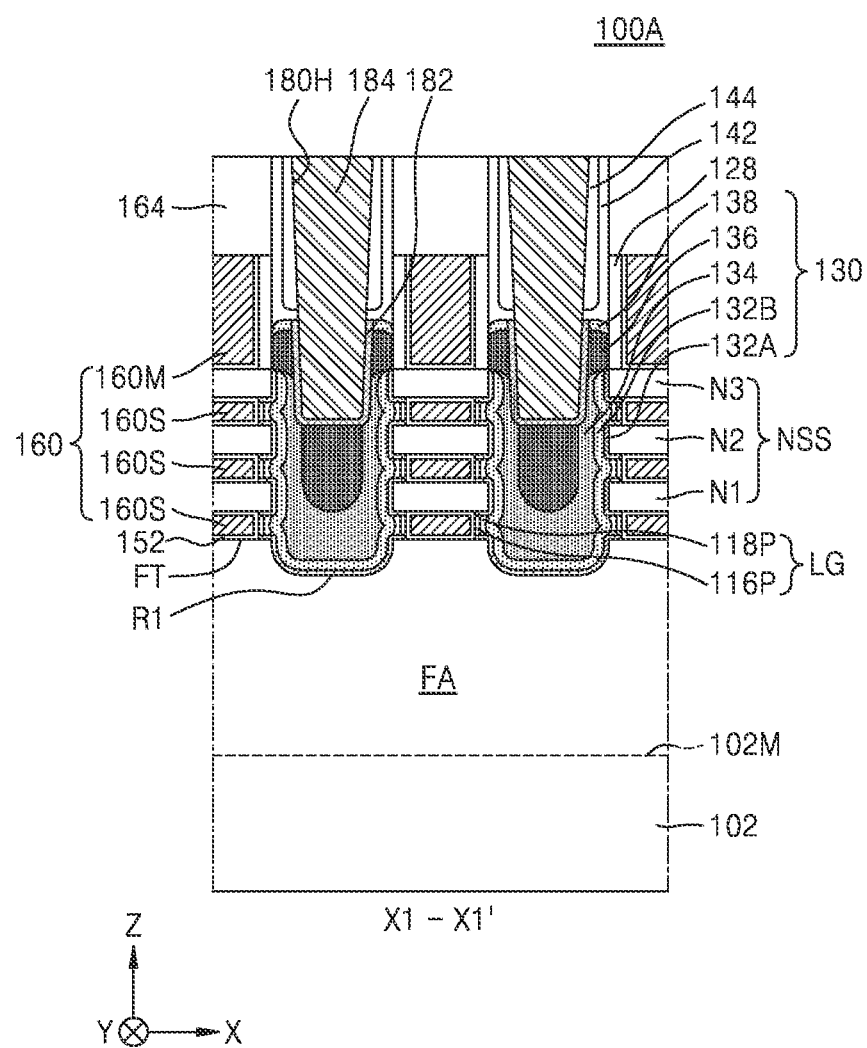
FIG. 3 is a cross-sectional view of an IC device according to some embodiments.

FIG. 3 is a cross-sectional view of an IC device 100A according to some embodiments. FIG. 3 illustrates some components in a portion corresponding to a cross-section taken along line X1-X1' of FIG. 1. In FIG. 3, the same reference numerals are used to denote the same elements as in FIGS. 1 and 2A to 2E, and detailed descriptions thereof are omitted for conciseness.

Referring to FIG. 3, the IC device 100A may have substantially the same configuration as the IC device 100 described with reference to FIGS. 1 and 2A to 2E. However, the IC device 100A may further include a plurality of source/drain contacts 184 respectively on a plurality of source/drain regions 130. Each of the plurality of source/drain contacts 184 may extend long in a vertical direction (Z direction) between a pair of gate lines 160, which are adjacent to each other, from among a plurality of gate lines 160. A metal silicide film 182 may be between the source/drain region 130 and the source/drain contact 184.

Each of the plurality of source/drain contacts 184 may fill a contact hole 180H, which passes through an inter-gate dielectric film 144 and an insulating liner 142 in the vertical direction (Z direction) and extends into the source/drain region 130. The source/drain region 130 may be apart from the source/drain contact 184 with the metal silicide film 182 therebetween. The source/drain region 130 may surround a lower portion of the source/drain contact 184 outside the contact hole 180H.

In some embodiments, each of the plurality of source/drain contacts 184 may include a metal, a conductive metal nitride, or a combination thereof. For example, each of the plurality of source/drain contacts 184 may include tungsten (W), copper (Cu), aluminum (Al), titanium (Ti), tantalum (Ta), titanium nitride (TiN), tantalum nitride (TaN), an alloy thereof, or a combination thereof. In some embodiments, the metal silicide film 182 may include titanium silicide, without being limited thereto. In some embodiments, the metal silicide film 182 may be omitted.

Figure 4A:
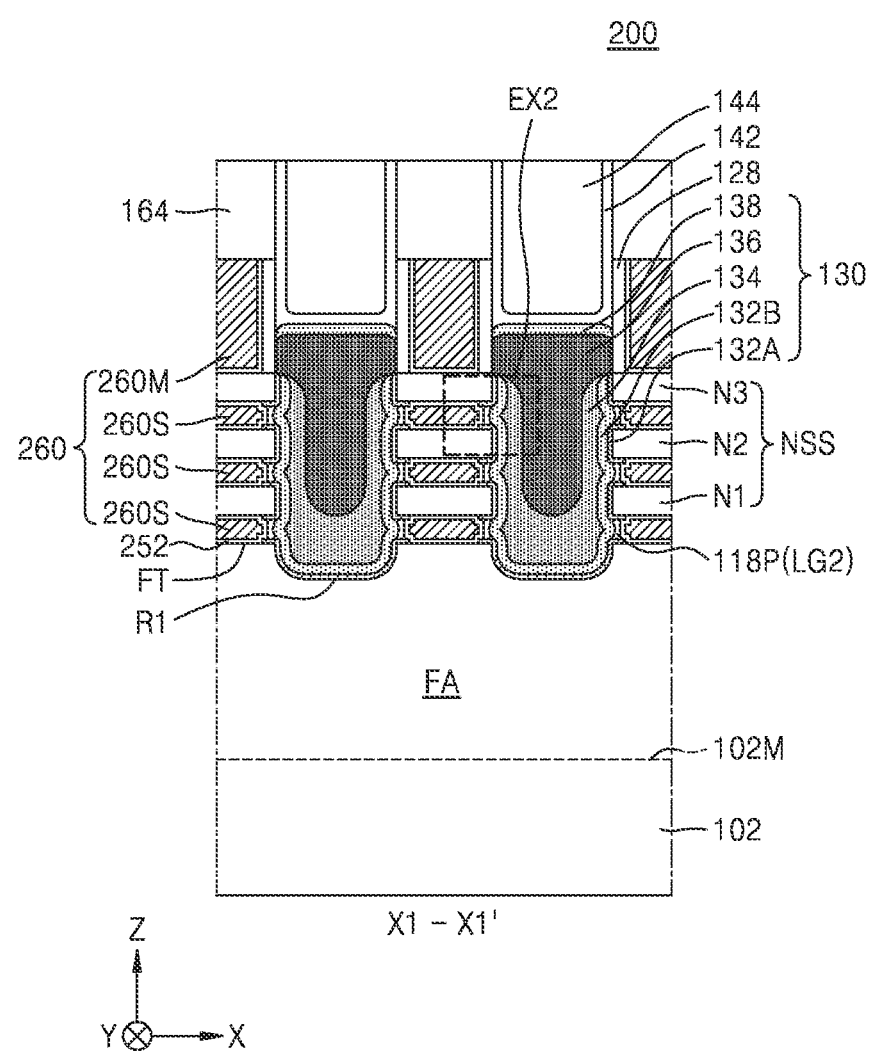
FIG. 4A is a cross-sectional view of an IC device according to some embodiments.
Figure 4B:
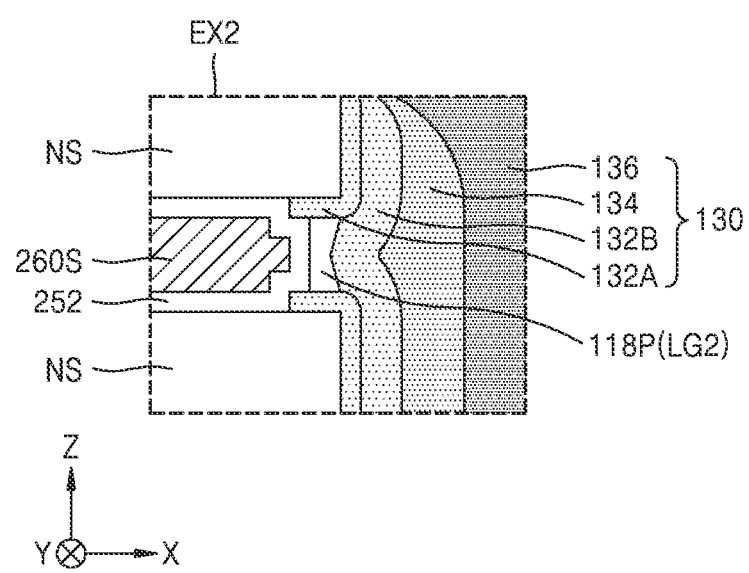
FIG. 4B is an enlarged cross-sectional view of a local region "EX2" of FIG. 4A.

FIG. 4A is a cross-sectional view of an IC device 200 according to some embodiments, and FIG. 4B is an enlarged cross-sectional view of a local region "EX2" of FIG. 4A. In FIGS. 4A and 4B, the same reference numerals are used to denote the same elements as in FIGS. 2A to 2E, and detailed descriptions thereof are omitted for conciseness.

Referring to FIGS. 4A and 4B, the IC device 200 may have substantially the same configuration as the IC device 100 described with reference to FIGS. 1 and 2A to 2E. However, the IC device 200 may include a local insulating guide LG2, which is between a pair of nanosheets that overlap each other in a vertical direction (Z direction) and are most adjacent to each other, from among a first nanosheet N1, a second nanosheet N2, and a third nanosheet N3 that are included in a nanosheet stack NSS.

The local insulating guide LG2 may substantially have the same configuration as the local insulating guide LG shown in FIGS. 2A to 2C. However, the local insulating guide LG2 may include a second insulating pattern 118P. The second insulating pattern 118P included in the local insulating guide LG2 may include a portion in contact with a gate dielectric film 252, a portion in contact with a first blocking layer 132A, and a portion in contact with a second blocking layer 132B. The second insulating pattern 118P may include a silicon oxide film, a silicon nitride film, or a combination thereof. For example, the second insulating pattern 118P may include a silicon oxide film, without being limited thereto.

Between the pair of nanosheets that are most adjacent to each other, from among the first to third nanosheets N1, N2, and N3 included in the nanosheet stack NSS, a portion of the gate dielectric film 252, which is in contact with the local insulating guide LG2, may be closer to the center of a source/drain region 130 than a portion of the gate dielectric film 252, which is in contact with the first blocking layer 132A. Between the pair of nanosheets, the gate dielectric film 252 and the sub-gate portion 260S may include portions that protrude toward the source/drain region 130. Details of the gate dielectric film 252 and the sub-gate portion 260S may be the same as those of the gate dielectric film 152 and the sub-gate portion 160S described with reference to FIGS. 2A to 2E and thus repeated description thereof is omitted for conciseness.

Figure 5:
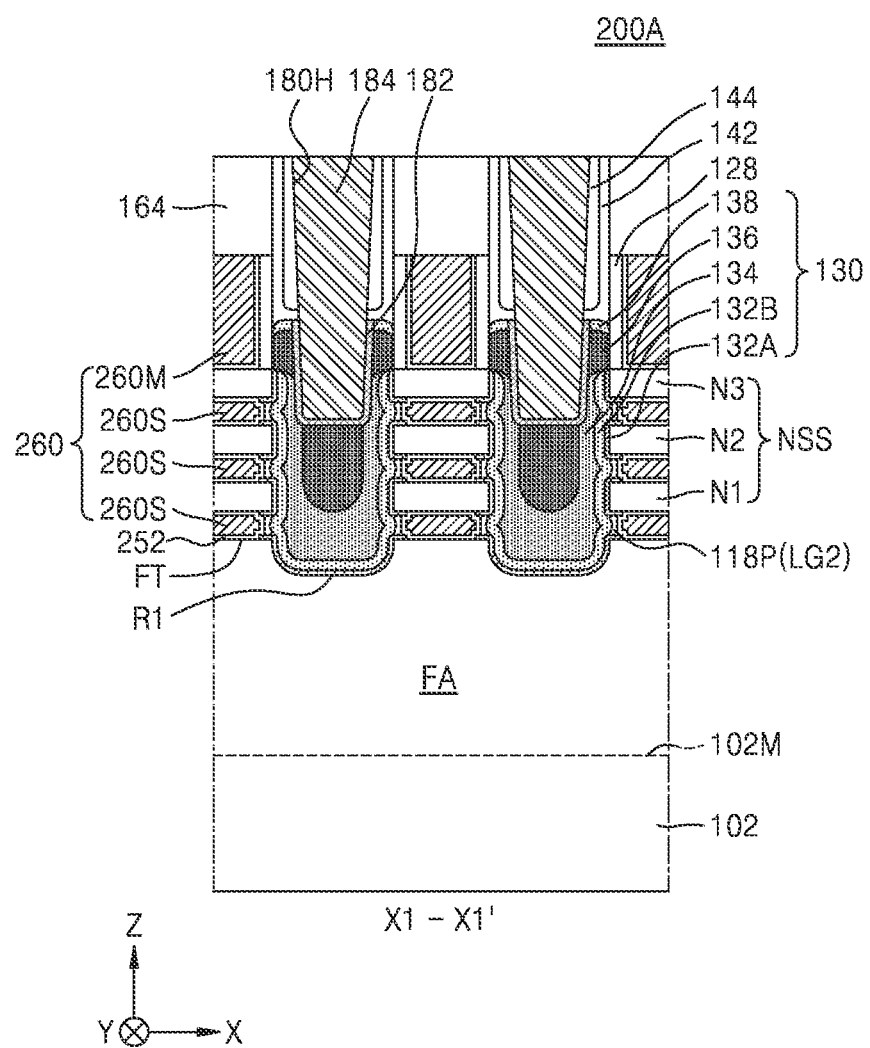
FIG. 5 is a cross-sectional view of an IC device according to some embodiments.

FIG. 5 is a cross-sectional view of an IC device 200A according to some embodiments. FIG. 5 illustrates some components in a portion corresponding to a cross-section taken along line X1-X1' of FIG. 1. In FIG. 5, the same reference numerals are used to denote the same elements as in FIGS. 4A, and 4B, and detailed descriptions thereof are omitted for conciseness.

Referring to FIG. 5, the IC device 200A may have substantially the same configuration as the IC device 200 described with reference to FIGS. 4A and 4B. However, the IC device 200A may further include a plurality of source/drain contacts 184 on a plurality of source/drain regions 130. A metal silicide film 182 may be between the source/drain region 130 and the source/drain contact 184.

Figure 6A:
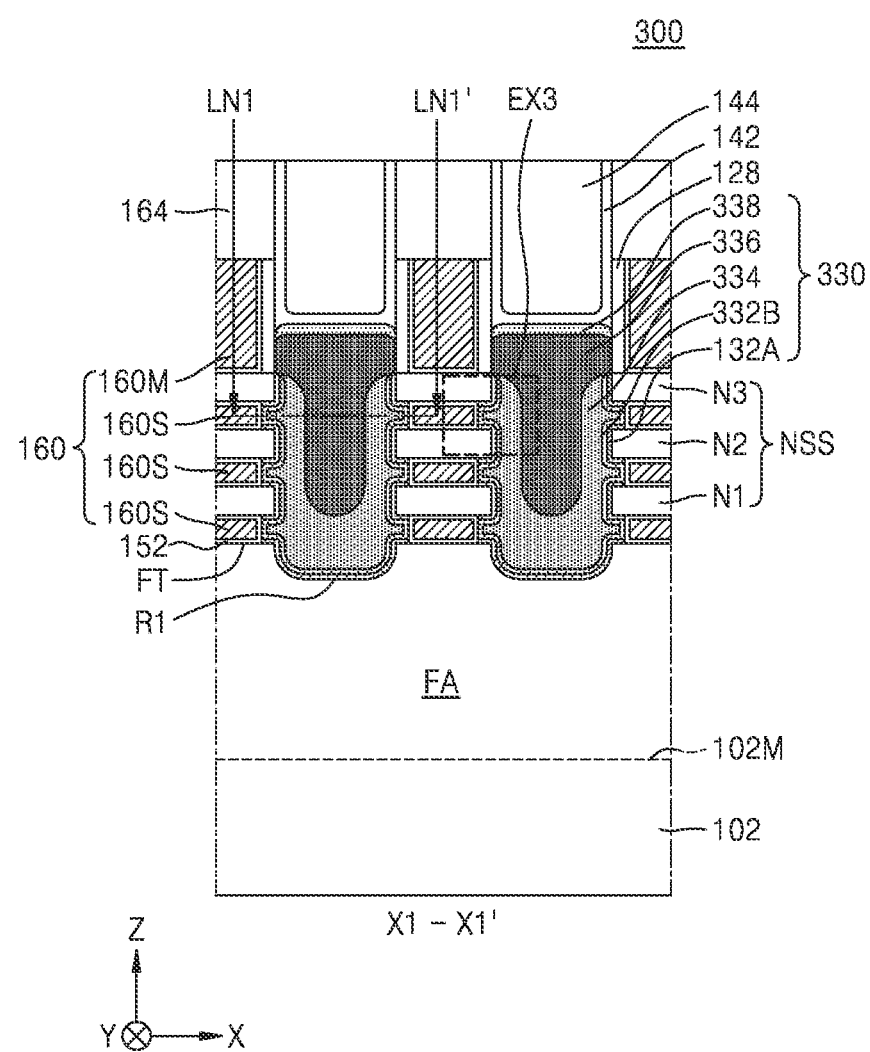
FIG. 6A is a cross-sectional view of an IC device according to some embodiments.
Figure 6B:
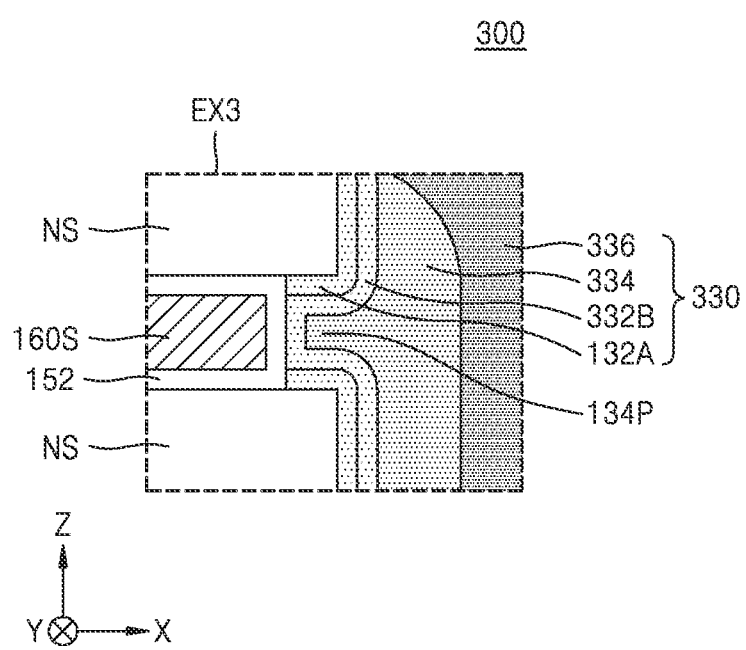
FIG. 6B is an enlarged cross-sectional view of a local region "EX3" of FIG. 6A.
Figure 6C:
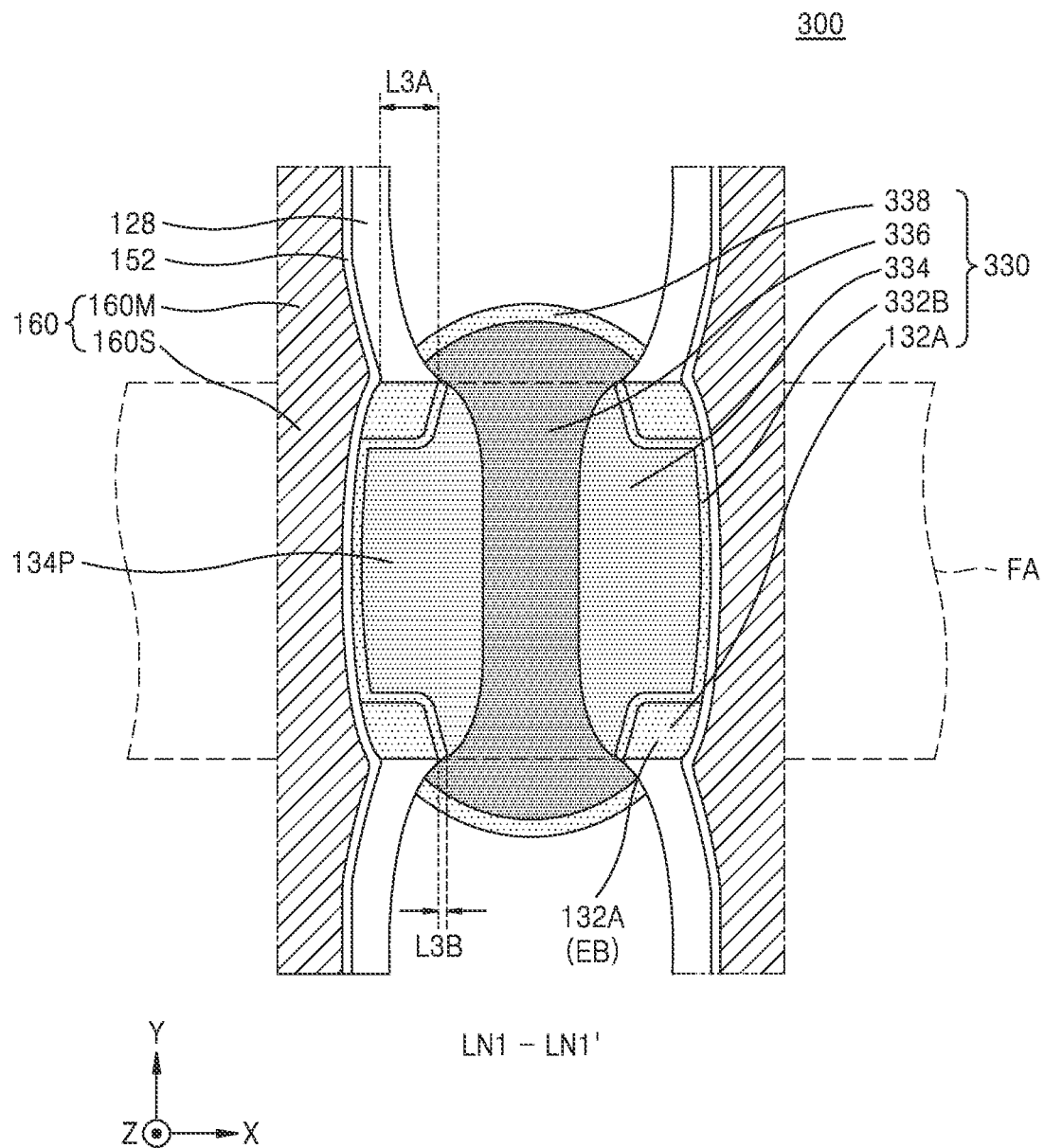
FIG. 6C is an enlarged plan view of some components at a vertical level according to a cross-section taken along line LN1-LN1' of FIG. 6A.

FIG. 6A is a cross-sectional view of an IC device 300 according to some embodiments. FIG. 6B is an enlarged cross-sectional view of a local region "EX3" of FIG. 6A. FIG. 6C is an enlarged plan view of some components at a vertical level according to a cross-section taken along line LN1-LN1' of FIG. 6A. In FIGS. 6A to 6C, the same reference numerals are used to denote the same elements as in FIGS. 2A to 2E, and detailed descriptions thereof are omitted for conciseness.

Referring to FIGS. 6A to 6C, the IC device 300 may have substantially the same configuration as the IC device 100 described with reference to FIGS. 1 and 2A to 2E. However, unlike the IC device 100, the IC device 300 may not include a local insulating guide LG.

In the IC device 300, each of a plurality of source/drain regions 330 may include a first blocking layer 132A, a second blocking layer 332B, a buffer layer 334, a main body layer 336, and a capping layer 338, which are sequentially stacked on a bottom surface of a recess R1 in a vertical direction (Z direction).

In each of the plurality of source/drain regions 330, the first blocking layer 132A may have the same configuration as that described with reference to FIGS. 2A to 2D. Between a pair of nanosheets, which overlap each other in the vertical direction (Z direction) and are most adjacent to each other from among a first nanosheet N1, a second nanosheet N2, and a third nanosheet N3, the second blocking layer 332B may include a portion in contact with the first blocking layer 132A and a portion in contact with a gate dielectric film 152. As shown in FIG. 6C, in a plan view (i.e., X-Y plane) parallel to a main surface 102M of a substrate 102, a width L3A of an edge bather enhancing portion EB of the first blocking layer 132A may be greater than a width L3B of the second blocking layer 332B in the first lateral direction (X direction). In some embodiments, a maximum width of the edge barrier enhancing portion EB of the first blocking layer 132A may be greater than a maximum width of the second blocking layer 332B in the first lateral direction (X direction). The buffer layer 334 may include a protrusion 134P, which protrudes toward the sub-gate portion 160S between the pair of nanosheets. The protrusion 134P of the buffer layer 334 may include a portion, which overlaps the first nanosheet N1, the second nanosheet N2, and the third nanosheet N3 in the vertical direction (Z direction).

In the IC device 300, between the pair of nanosheets, the gate dielectric film 152 may include a portion between the sub-gate portion 160S and the first blocking layer 132A and a portion between the sub-gate portion 160S and the second blocking layer 332B. Details of the second blocking layer 332B, the buffer layer 334, the main body layer 336, and the capping layer 338, which are included in the source/drain region 330 of the IC device 300, may be the same as those of the second blocking layer 132B, the buffer layer 134, the main body layer 136, and the capping layer 138 described with reference to FIGS. 2A to 2D and thus a repeated description thereof is omitted for conciseness.

Figure 7:
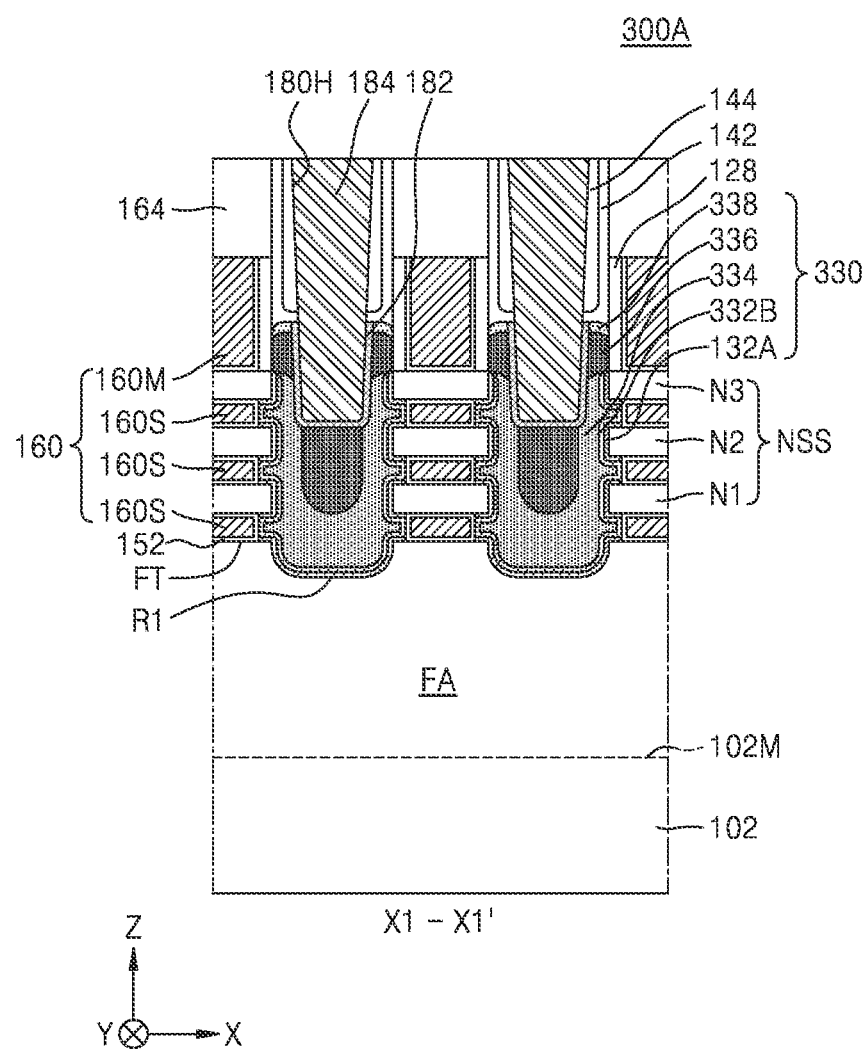
FIG. 7 is a cross-sectional view of an IC device according to some embodiments.

FIG. 7 is a cross-sectional view of an IC device 300A according to some embodiments. FIG. 7 illustrates some components in a portion corresponding to a cross-section taken along line X1-X1' of FIG. 1. In FIG. 7, the same reference numerals are used to denote the same elements as in FIGS. 6A to 6C, and detailed descriptions thereof are omitted for conciseness.

Referring to FIG. 7, the IC device 300A may have substantially the same configuration as the IC device 300 described with reference to FIGS. 6A to 6C. However, the IC device 300A may further include a plurality of source/drain contacts 184 on the plurality of source/drain regions 330. A metal silicide film 182 may be between the source/drain region 330 and the source/drain contact 184.

Figure 8:
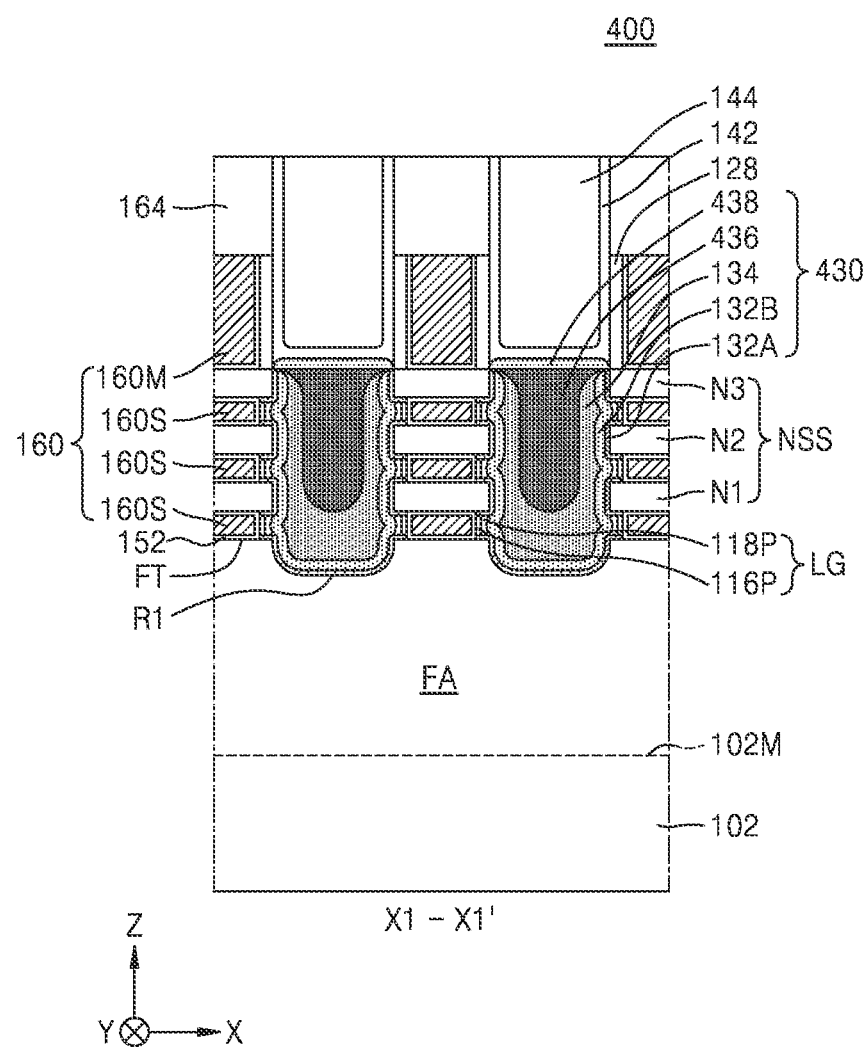
FIG. 8 is a cross-sectional view of an IC device according to some embodiments.

FIG. 8 is a cross-sectional view of an IC device 400 according to some embodiments. In FIG. 8, the same reference numerals are used to denote the same elements as in FIGS. 2A to 2E, and detailed descriptions thereof are omitted for conciseness.

Referring to FIG. 8, the IC device 400 may have substantially the same configuration as the IC device 100 described with reference to FIGS. 1 and 2A to 2E. However, the IC device 400 may include a plurality of source/drain regions 430.

In the IC device 400, each of the plurality of source/drain regions 430 may include a first blocking layer 132A, a second blocking layer 132B, a buffer layer 134, a main body layer 436, and a capping layer 438, which are sequentially stacked on a bottom surface of a recess R1 in a vertical direction (Z direction). A top surface of the main body layer 436 may be substantially at the same vertical level as a top surface of the nanosheet stack NSS. In other words, the top surface of the main body layer 436 may be coplanar with the top surface of the nanosheet stack NSS. The capping layer 438 may cover a top surface of the main body layer 436 at substantially the same level as the top surface of the main body layer 436. Details of the main body layer 436 and the capping layer 438 may be substantially the same as those of the main body layer 136 and the capping layer 138, which have been described with reference to FIGS. 2A to 2D and thus repeated description thereof is omitted for conciseness.

Figure 9:
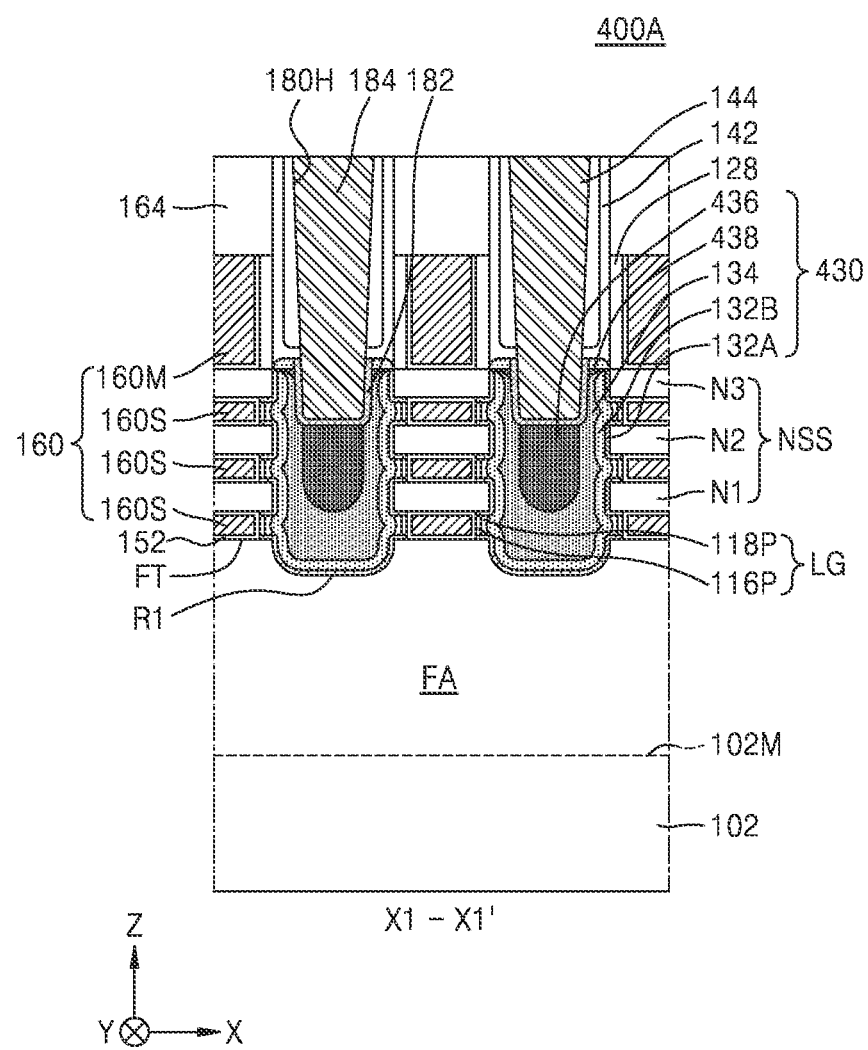
FIG. 9 is a cross-sectional view of an IC device according to some embodiments.

FIG. 9 is a cross-sectional view of an IC device 400A according to some embodiments. FIG. 9 illustrates some components in a portion corresponding to a cross-section taken along line X1-X1' of FIG. 1. In FIG. 9, the same reference numerals are used to denote the same elements as in FIG. 8, and detailed descriptions thereof are omitted for conciseness.

Referring to FIG. 9, the IC device 400A may have substantially the same configuration as the IC device 400 described with reference to FIG. 8. However, the IC device 400A may further include a plurality of source/drain contacts 184 on a plurality of source/drain regions 430. A metal silicide film 182 may be between the source/drain region 430 and the source/drain contact 184.

Figure 10:
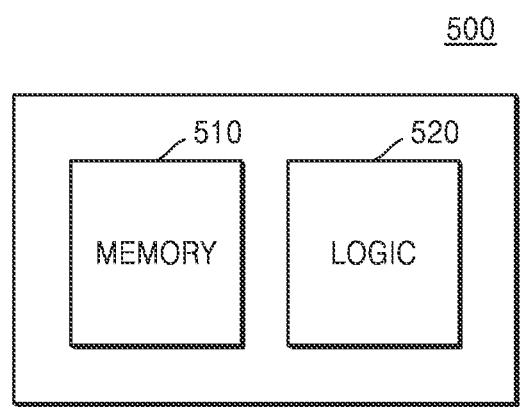
FIG. 10 is a block diagram of an IC device according to some embodiments.

FIG. 10 is a block diagram of an IC device 500 according to some embodiments.

Referring to FIG. 10, the IC device 500 may include a memory region 510 and a logic region 520. At least one of the memory region 510 and the logic region 520 may include at least one of the configurations of the IC devices 100, 100A, 200, 200A, 300, 300A, 400, and 400A, which have been described with reference to FIGS. 1 to 9.

The memory region 510 may include at least one of static random access memory (SRAM), dynamic RAM (DRAM), magnetic RAM (MRAM), resistive RAM (RRAM), or phase-change RAM (PRAM). For example, the memory region 510 may include SRAM. The logic region 520 may include standard cells (e.g., counters and buffers) configured to perform desired logical functions. The standard cells may include various kinds of logic cells including a plurality of circuit elements, such as transistors and registers. The logic cell may include an AND, a NAND, an OR, a NOR, an exclusive OR (XOR), an exclusive NOR (XNOR), an inverter (INV), an adder (ADD), a buffer (BUF), a delay (DLY), a filter (FIL), a multiplexer (MXT/MXIT), an OR/AND/INVERTER (OAI), an AND/OR (AO), an AND/OR/INVERTER (AOI), a D-flip-flop, a reset flip-flop, a master-slave flip-flop, and/or a latch.

FIGS. 11 to 26 are diagrams of a process sequence of a method of manufacturing an IC device, according to some embodiments. Specifically, FIGS. 11 to 13, 14A, 15A, 16A, 17A, 18A, 19A, and 20 to 26 are cross-sectional views of a portion corresponding to the cross-section taken along line X1-X1' of FIG. 1, according to a process sequence. FIGS. 14B, 15B, 16B, 17B, 18B, and 19B are respectively enlarged cross-sectional views of local regions "EX1" of FIGS. 14A, 15A, 16A, 17A, 18A, and 19A. FIGS. 17C, 18C, and 19C are respectively enlarged plan views of some components at a vertical level corresponding to cross-sections taken along lines LN1-LN1' of FIGS. 17A, 18A, and 19A. An example method of manufacturing the IC device 100 shown in FIGS. 1 and 2A to 2E will now be described with reference to FIGS. 11 to 26. In FIGS. 11 to 26, the same reference numerals are used to denote the same elements as in FIGS. 2A to 2E, and detailed descriptions thereof are omitted for conciseness.

Figure 11:
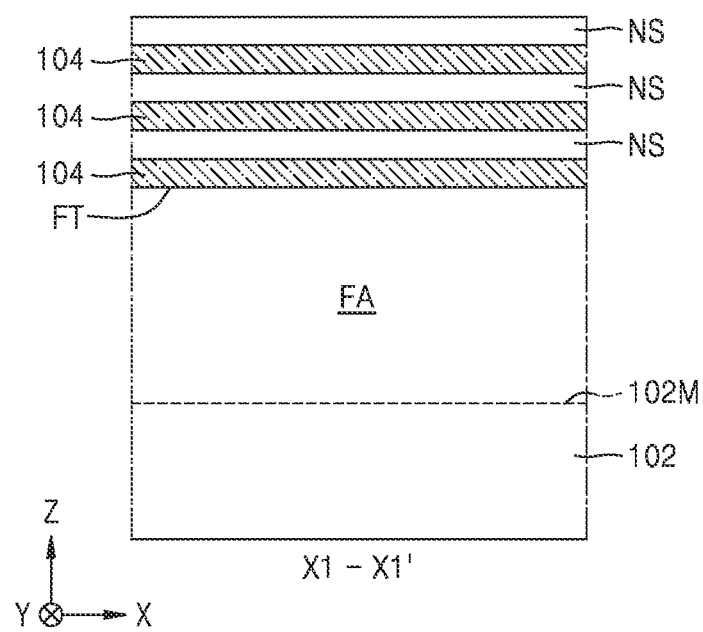

Referring to FIG. 11, a plurality of sacrificial semiconductor layers 104 and a plurality of nanosheet semiconductor layers NS may be alternately stacked one-by-one on a substrate 102. Thereafter, portions of the plurality of sacrificial semiconductor layers 104, the plurality of nanosheet semiconductor layers NS, and the substrate 102 may be etched to define a plurality of fin-type active regions FA in the substrate 102. Thereafter, a preliminary device isolation film may be formed to cover sidewalls of each of the plurality of fin-type active regions FA. The preliminary device isolation film may be a preliminary structure for forming the device isolation film 114 shown in FIG. 2E. The stack structure of the plurality of sacrificial semiconductor layers 104 and the plurality of nanosheet semiconductor layers NS may remain on the fin top surface FT of each of the plurality of fin-type active regions FA.

The plurality of sacrificial semiconductor layers 104 and the plurality of nanosheet semiconductor layers NS may include semiconductor materials having different etch selectivities. In some embodiments, the plurality of nanosheet semiconductor layers NS may include a silicon (Si) layer, and the plurality of sacrificial semiconductor layers 104 may include a silicon germanium (SiGe) layer. In some embodiments, the plurality of sacrificial semiconductor layers 104 may have a constant Ge content. The SiGe layer included in the plurality of sacrificial semiconductor layers 104 may have a constant Ge content, which is selected in a range of about 5 at % to about 60 at %, for example, about 10 at % to about 40 at %. The Ge content of the SiGe layer included in the plurality of sacrificial semiconductor layers 104 may be variously selected as needed.

Figure 12:
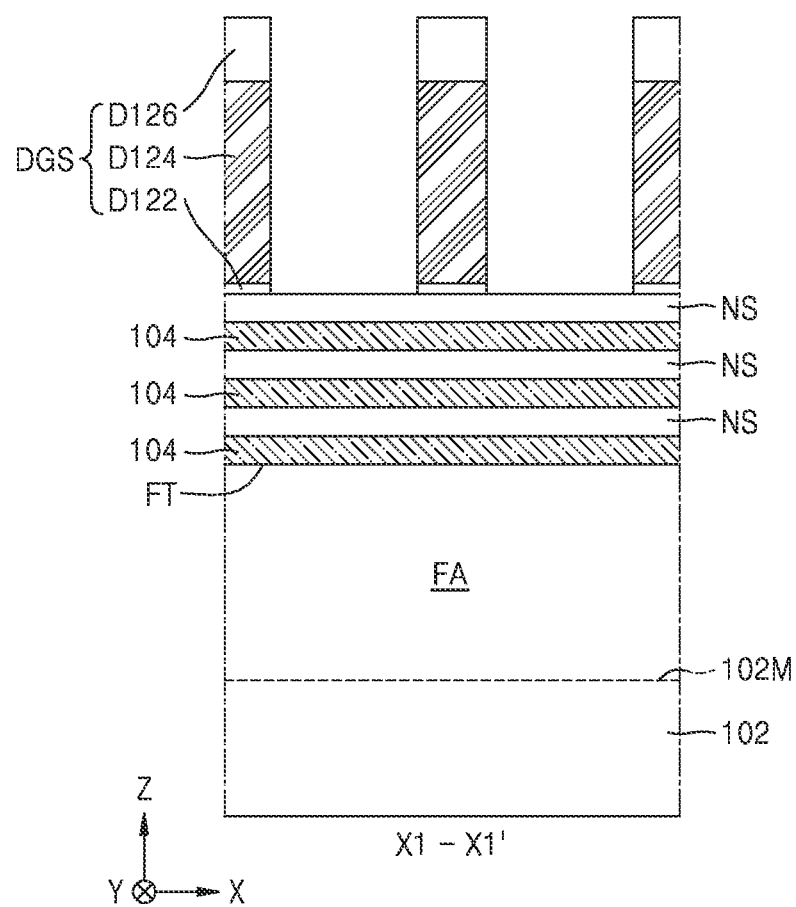

Referring to FIG. 12, a plurality of dummy gate structures DGS may be formed on the stack structure of the plurality of sacrificial semiconductor layers 104 and the plurality of nanosheet semiconductor layers NS.

Each of the plurality of dummy gate structures DGS may be formed to extend long in a second lateral direction (Y direction). Each of the plurality of dummy gate structures DGS may have a structure in which an oxide film D122, a dummy gate layer D124, and a capping layer D126 are sequentially stacked. In some embodiments, the dummy gate layer D124 may include polysilicon, and the capping layer D126 may include a silicon nitride film.

Figure 13:
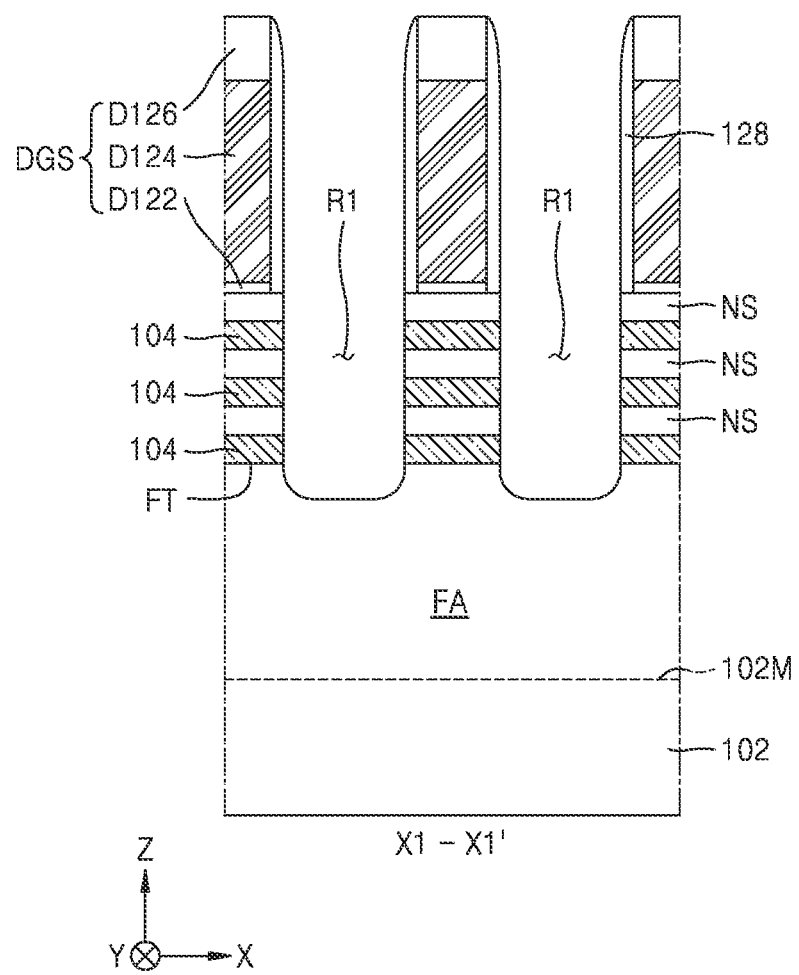

Referring to FIG. 13, a plurality of outer insulating spacers 128 may be formed to cover both sidewalls of each of the plurality of dummy gate structures DGS. Thereafter, respective portions of the plurality of sacrificial semiconductor layers 104 and the plurality of nanosheet semiconductor layers NS and a portion of the fin-type active region FA may be etched by using the plurality of dummy gate structures DGS and the plurality of outer insulating spacers 128 as etch masks. Thus, the plurality of nanosheet semiconductor layers NS may be divided into a plurality of nanosheet stacks NSS, and a plurality of recesses R1 may be formed in an upper portion of the fin-type active region FA. Each of the plurality of nanosheet stacks NSS may include a first nanosheet N1, a second nanosheet N2, and a third nanosheet N3. To form the plurality of recesses R1, an etching process may be performed by using a dry etching process, a wet etching process, or a combination thereof. After the plurality of recesses R1 are formed, a height of the preliminary device isolation film formed in the process described with reference to FIG. 11 may be reduced, and thus, the device isolation film 114 shown in FIG. 2E may be obtained.

Figure 14A:
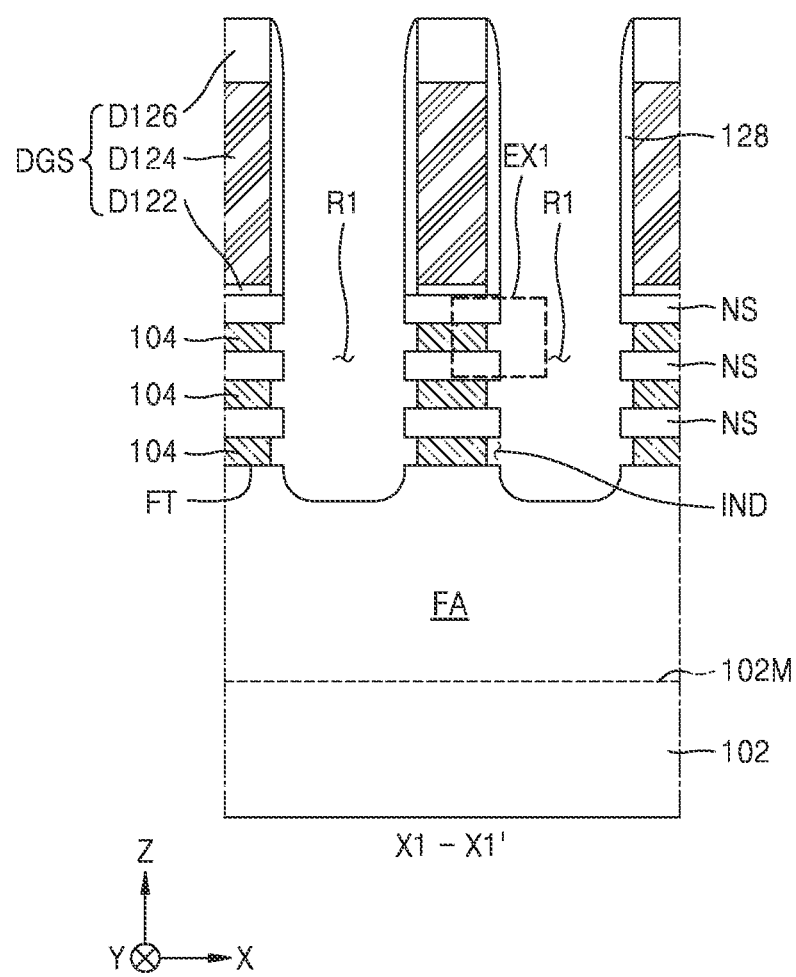
Figure 14B:
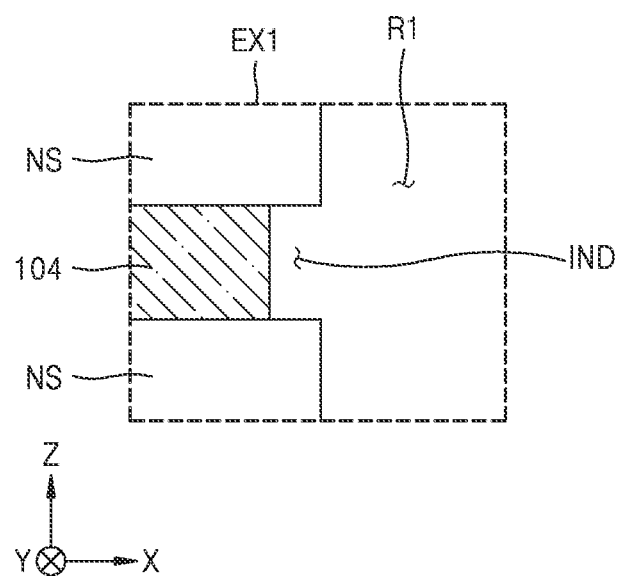
FIGS. 14B, 15B, 16B, 17B, 18B, and 19B are respectively enlarged cross-sectional views of local regions "EX1" of FIGS. 14A, 15A, 16A, 17A, 18A, and 19A, and FIGS. 17C, 18C, and 19C are respectively enlarged plan views of some components at a vertical level corresponding to cross-sections taken along lines LN1-LN1' of FIGS. 17A, 18A, and 19A.

Referring to FIGS. 14A and 14B, in the resultant structure of FIG. 13, portions of the plurality of sacrificial semiconductor layers 104 exposed at the plurality of recesses R1 may be selectively etched from the plurality of recesses R1. Thus, a plurality of indent regions IND may be formed one-by-one between a pair of nanosheets that overlap each other in a vertical direction (Z direction) and are most adjacent to each other, from among the first to third nanosheets N1, N2, and N3 that are included in the nanosheet stack NSS.

In some embodiments, to form the plurality of indent regions IND, portions of the plurality of sacrificial semiconductor layers 104 may be selectively etched by using etch selectivities of the first to third nanosheets N1, N2, and N3 with respect to the plurality of sacrificial semiconductor layers 104. A liquid or gaseous etchant may be used to selectively remove portions of the plurality of sacrificial semiconductor layers 104. In some embodiments, to selectively remove portions of the plurality of sacrificial semiconductor layers 104, a $CH_3COOH$-based etchant, for example, an etchant including a mixture of $CH_3COOH$, $HNO_3$, and HF or an etchant including a mixture of $CH_3COOH$, $H_2O_2$, and HF may be used, without being limited thereto.

Figure 15A:
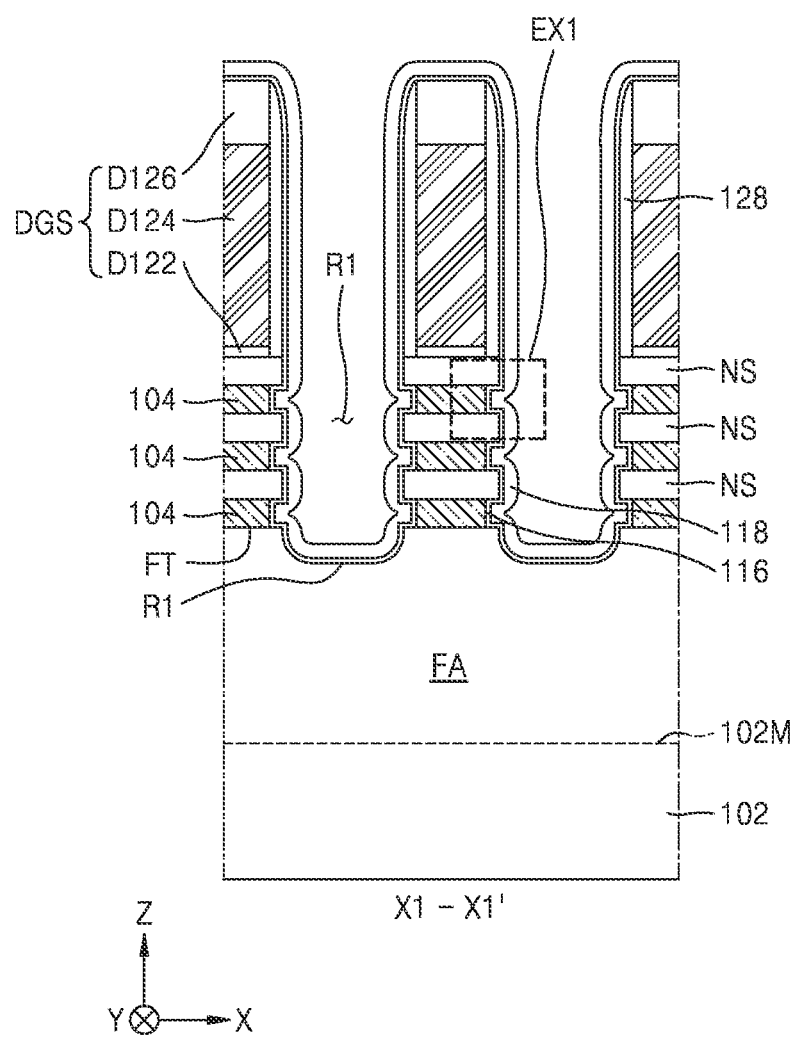
Figure 15B:
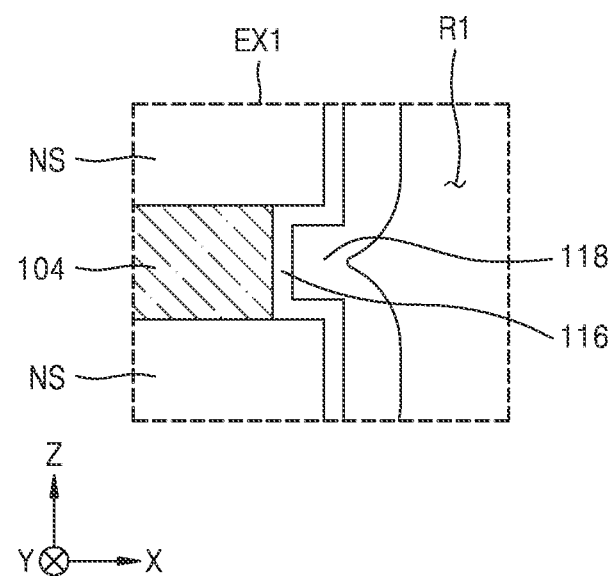

Referring to FIGS. 15A and 15B, a first insulating layer 116 and a second insulating layer 118 may be sequentially formed to sequentially cover exposed surfaces of the resultant structure of FIGS. 14A and 14B. The first insulating layer 116 may be formed to conformally cover the exposed surfaces of the resultant structure of FIGS. 14A and 14B. The second insulating layer 118 may be formed to such a sufficient thickness as to fill the indent region IND remaining on the first insulating layer 116.

The first insulating layer 116 and the second insulating layer 118 may include different materials from each other. For example, the first insulating layer 116 may include a silicon nitride film, and the second insulating layer 118 may include a silicon oxide film.

Figure 16A:
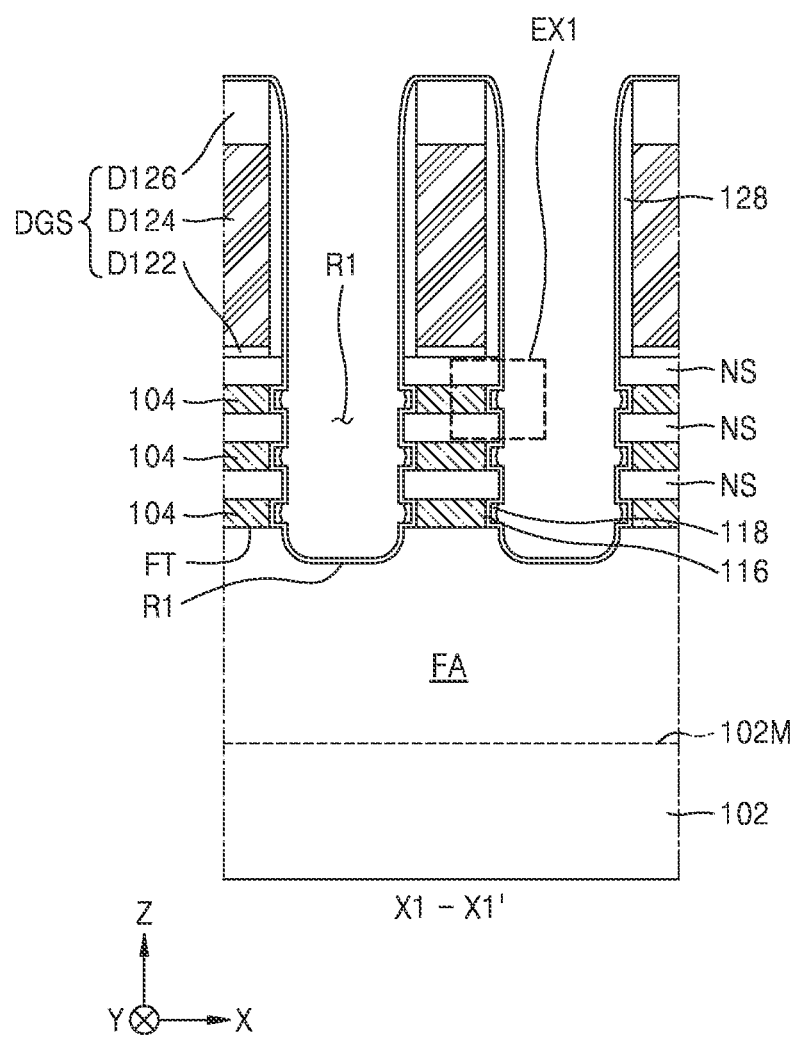
Figure 16B:
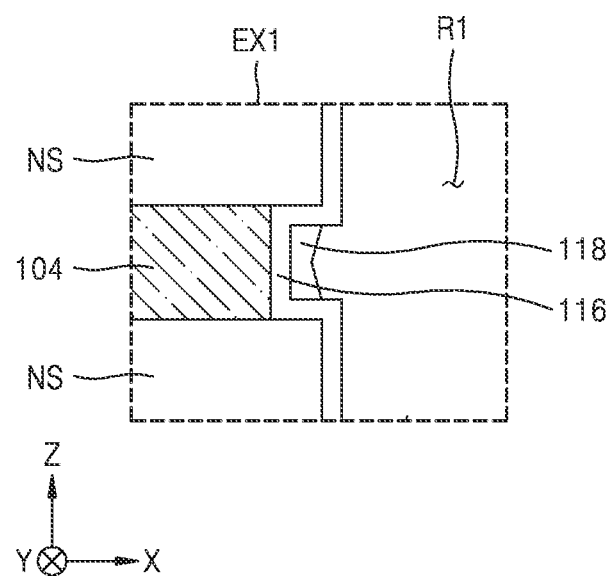

Referring to FIGS. 16A and 16B, in the resultant structure of FIGS. 15A and 15B, the second insulating layer 118 may be partially etched, and thus, the first insulating layer 116 may be exposed at the plurality of recesses R1, and partial regions of the second insulating layer 118 may remain inside the plurality of indent regions IND.

Figure 17A:
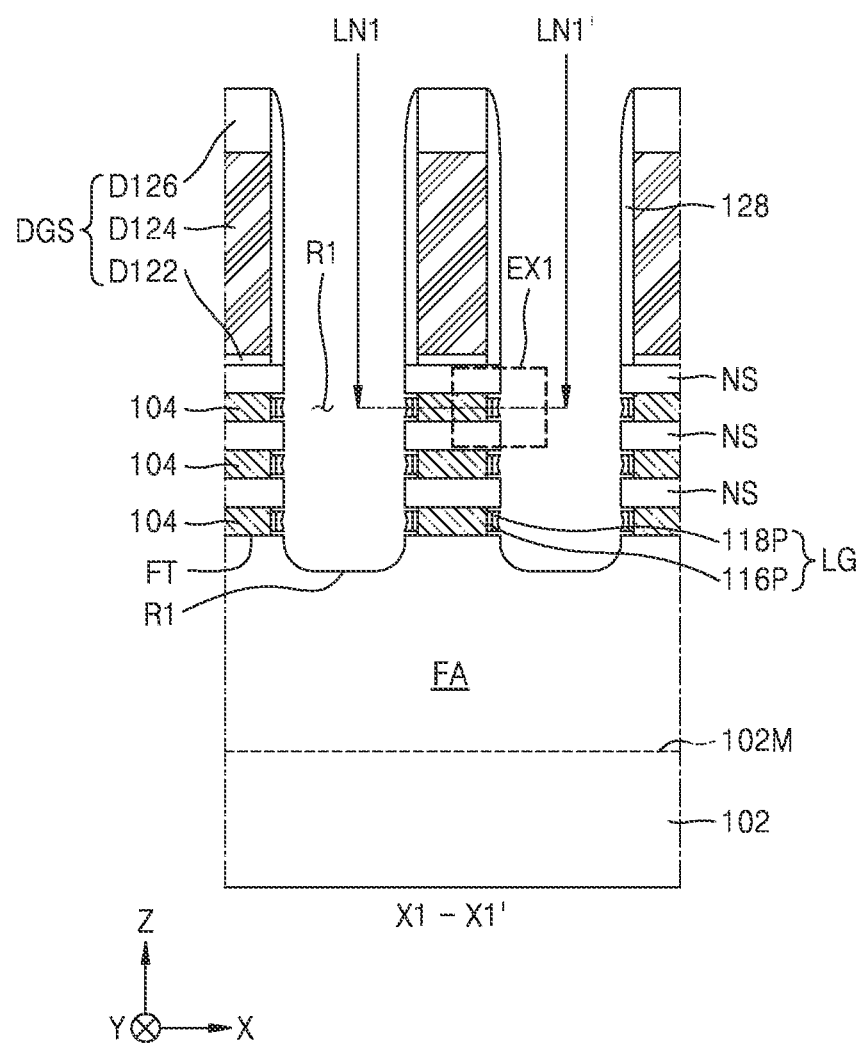
Figure 17B:
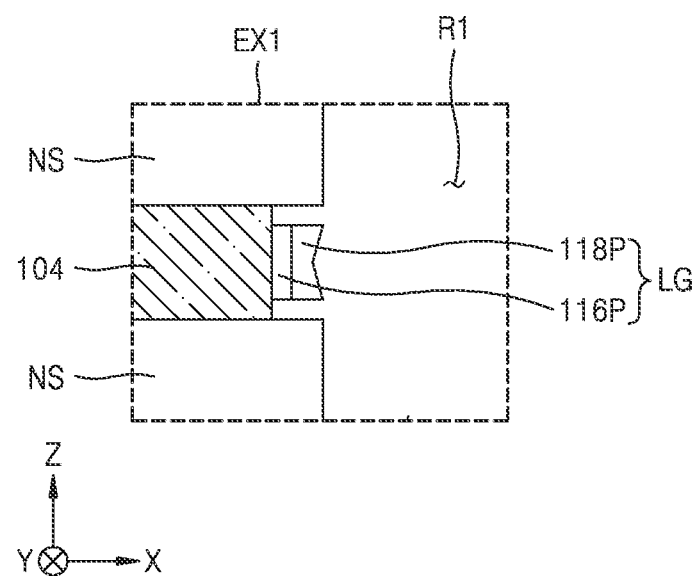
Figure 17C:
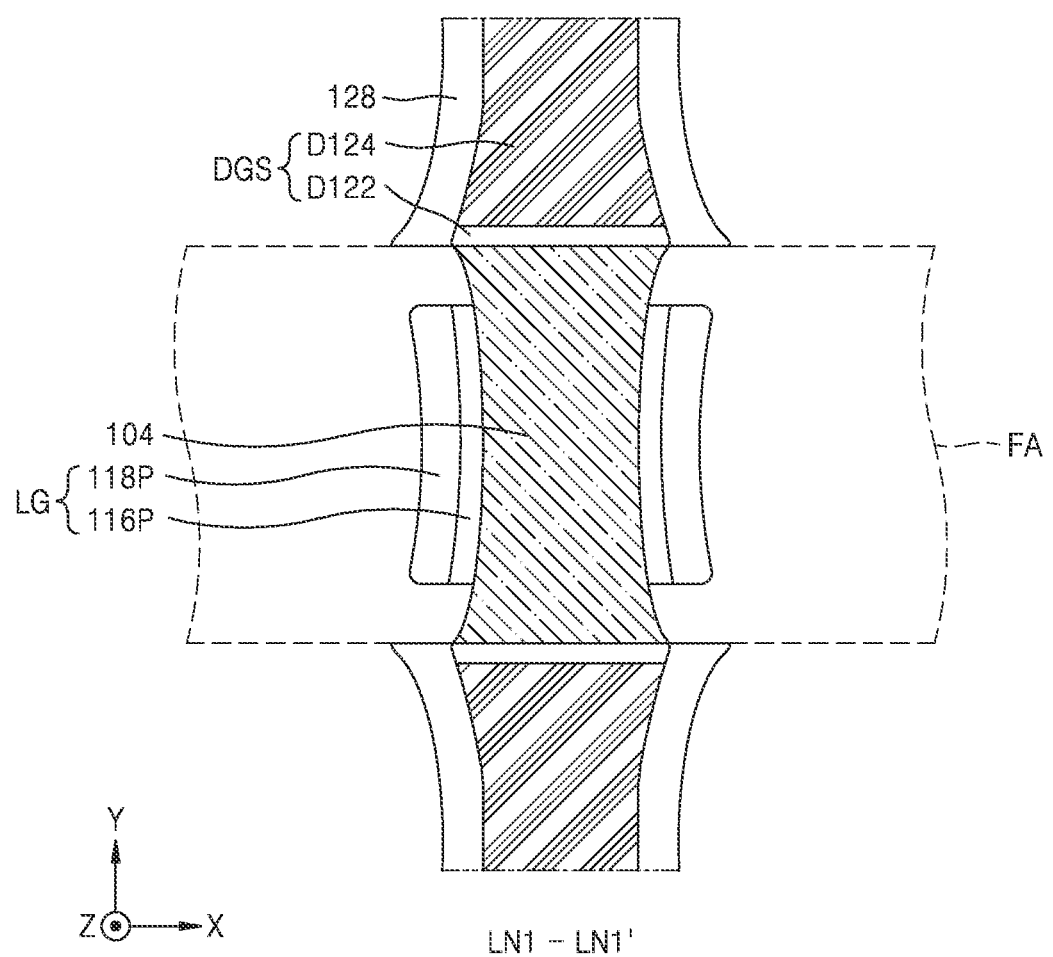

Referring to FIGS. 17A, 17B, and 17C, the first insulating layer 116 remaining in the resultant structure of FIGS. 16A and 16B may be partially removed, and thus, the sacrificial semiconductor layer 104 may be exposed at each of the plurality of indent regions IND.

After the sacrificial semiconductor layer 104 is exposed in each of the plurality of indent regions IND, a first insulating pattern 116P and a second insulating pattern 118P may be obtained from portions of the first insulating layer 116 and the second insulating layer 118, which remain in each of the plurality of indent regions IND. The first insulating pattern 116P and the second insulating pattern 118P may constitute a local insulating guide LG. The sacrificial semiconductor layer 104 may be exposed along the periphery of the local insulating guide LG in each of the plurality of indent regions IND. After the local insulating guide LG is formed, as shown in FIG. 17B, the sacrificial semiconductor layer 104 may be exposed around each of upper and lower portions of the local insulating guide LG in the vertical direction (Z direction). As shown in FIG. 17C, the sacrificial semiconductor layer 104 may be exposed around each of both sidewalls of the local insulating guide LG in the second lateral direction (Y direction).

Figure 18A:
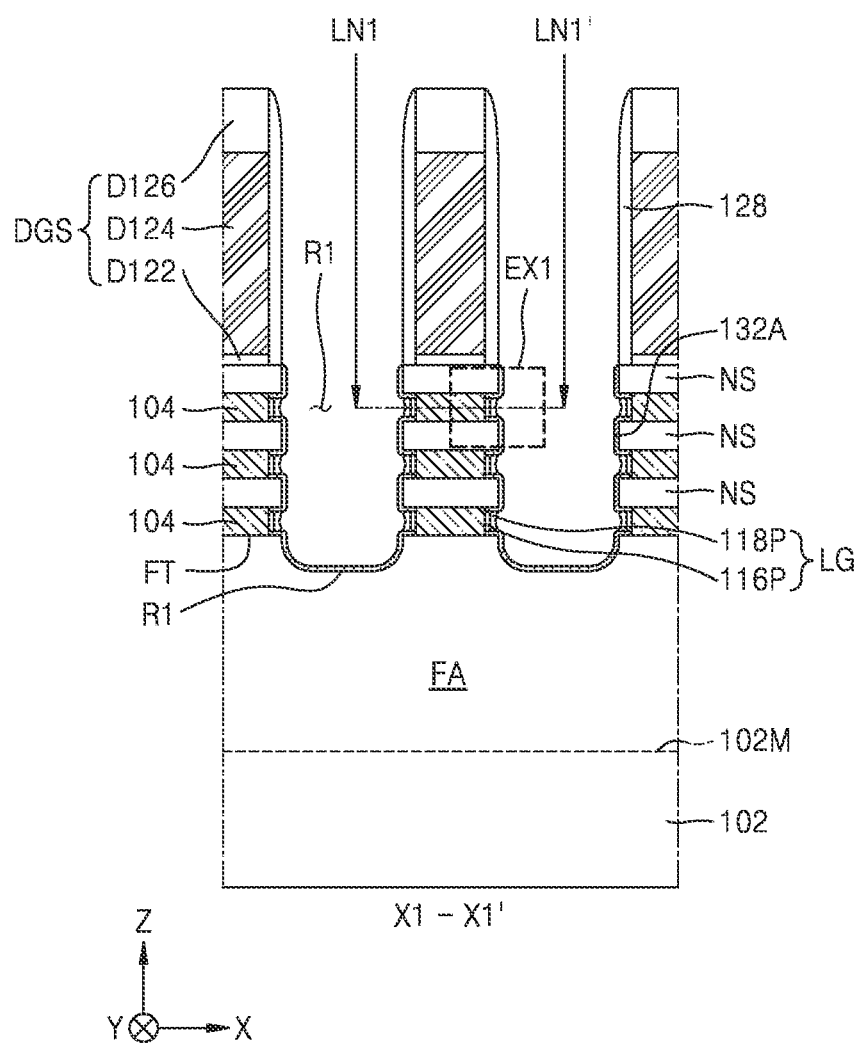
Figure 18B:
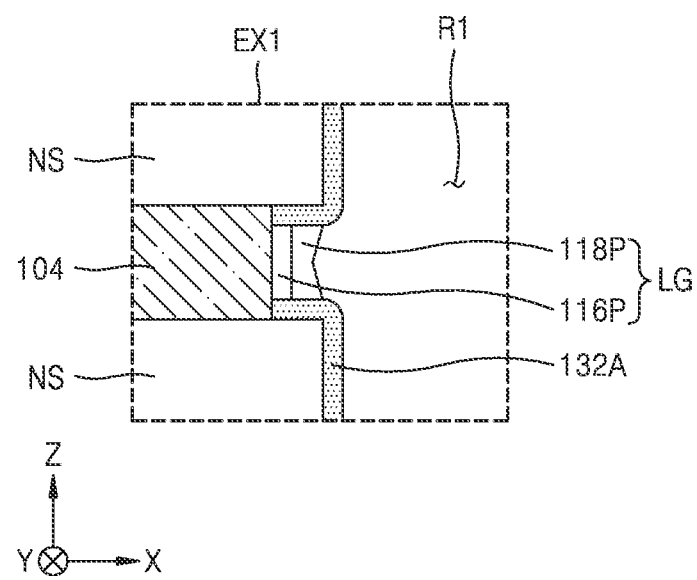
Figure 18C:
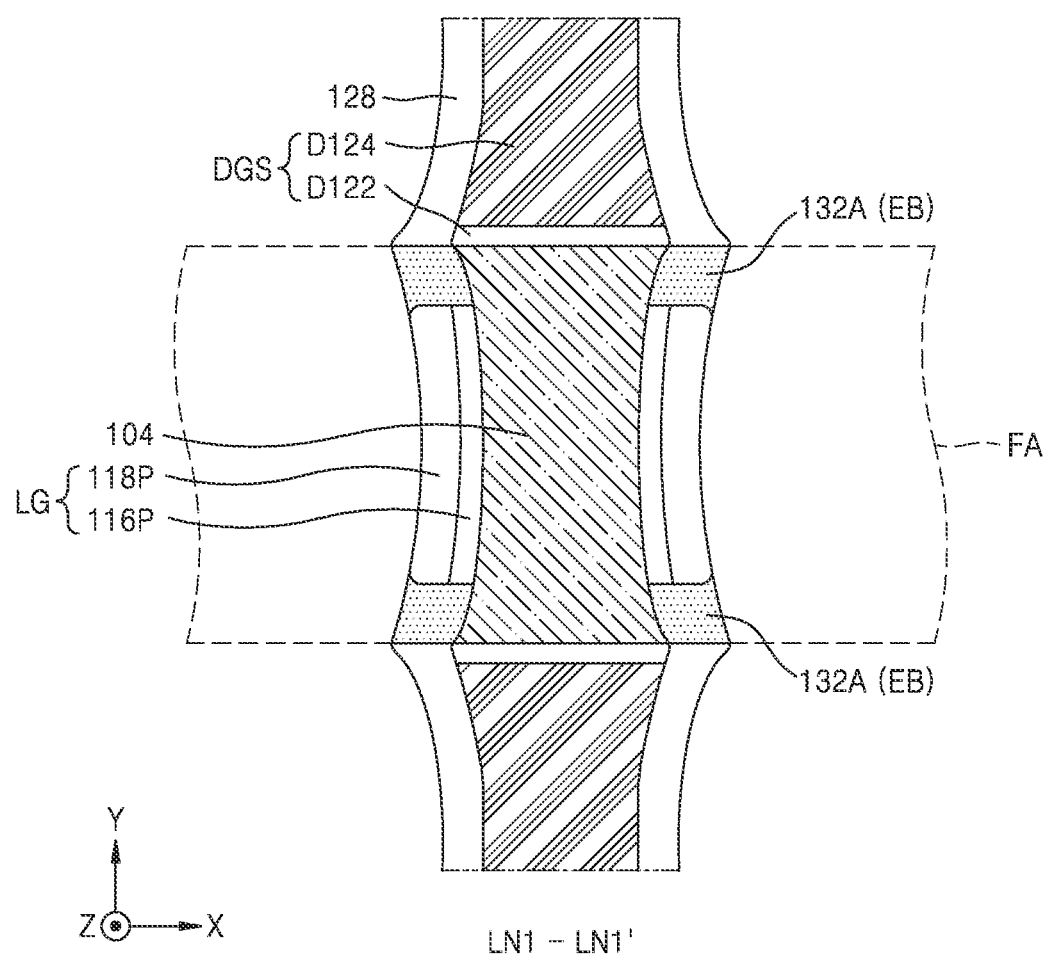

Referring to FIGS. 18A, 18B, and 18C, in the resultant structure of FIGS. 17A, 17B, and 17C, a first blocking layer 132A may be formed inside the plurality of recesses R1. The first blocking layer 132A may be formed to include at least one edge barrier enhancing portion EB. For example, the first blocking layer 132A may be formed to include four edge barrier enhancing portions EB.

In some embodiments, to form the first blocking layer 132A, a semiconductor material may be epitaxially grown from a surface of the fin-type active region FA exposed at a bottom surface of the recess R1, sidewalls of each of the first to third nanosheets N1, N2, and N3 in the nanosheet stack NSS, and an exposed portion of each of the plurality of sacrificial semiconductor layers 104.

In some embodiments, to form the first blocking layer 132A, a low-pressure chemical vapor deposition (LPCVD) process, a selective epitaxial growth (SEG) process, or a cyclic deposition and etching (CDE) process may be performed by using source materials including an element semiconductor precursor. The element semiconductor precursor may include a silicon (Si) source and a germanium (Ge) source.

In some embodiments, to form the first blocking layer 132A, the Si source and the Ge source may be used. Silane ($SiH_4$), disilane ($Si_2H_6$), trisilane ($Si_3H_8$), and/or dichlorosilane ($SiH_2Cl_2$) may be used as the silicon source, without being limited thereto. Germane ($GeH_4$), digermane ($Ge_2H_6$), trigermane ($Ge_3H_8$), tetragermane ($Ge_4H_{10}$), and/or dichlorogermane ($Ge_2H_2Cl_2$) may be used as the Ge source, without being limited thereto. When the first blocking layer 132A includes a SiGe layer doped with boron (B) atoms, diborane ($B_2H_6$), triborane, tetraborane, and/or pentaborane may be used as a B source, without being limited thereto.

Figure 19A:
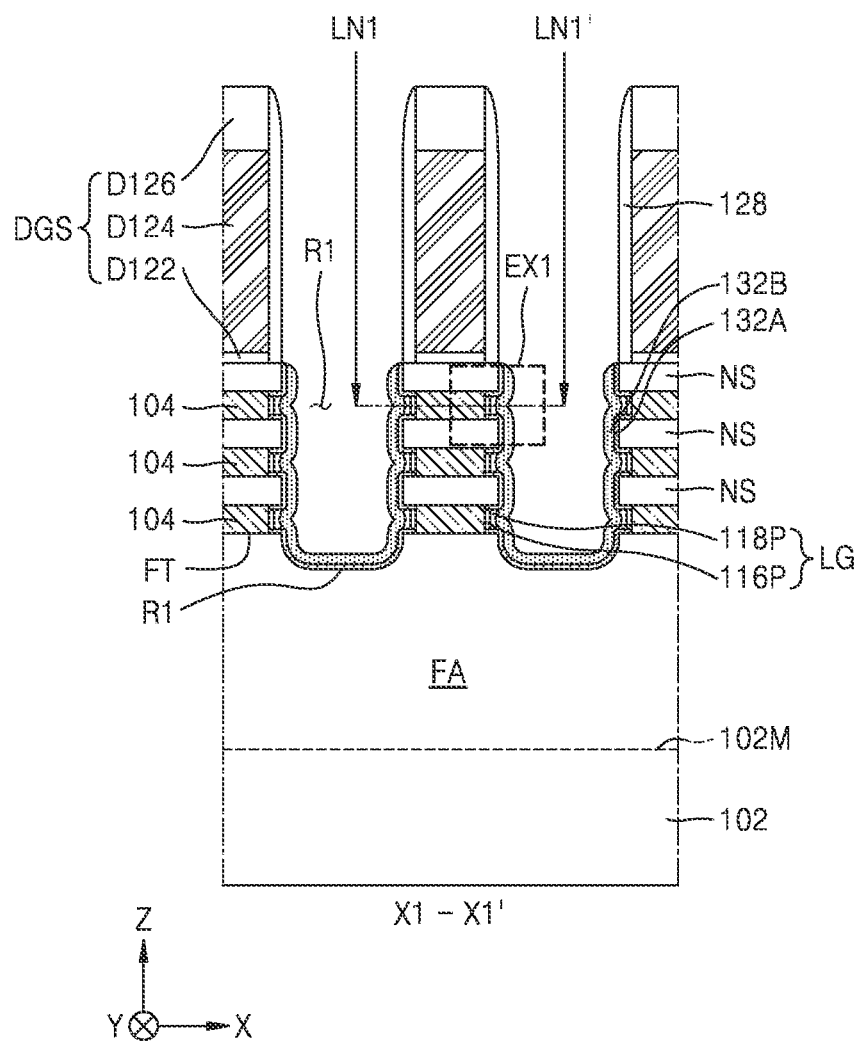
Figure 19B:
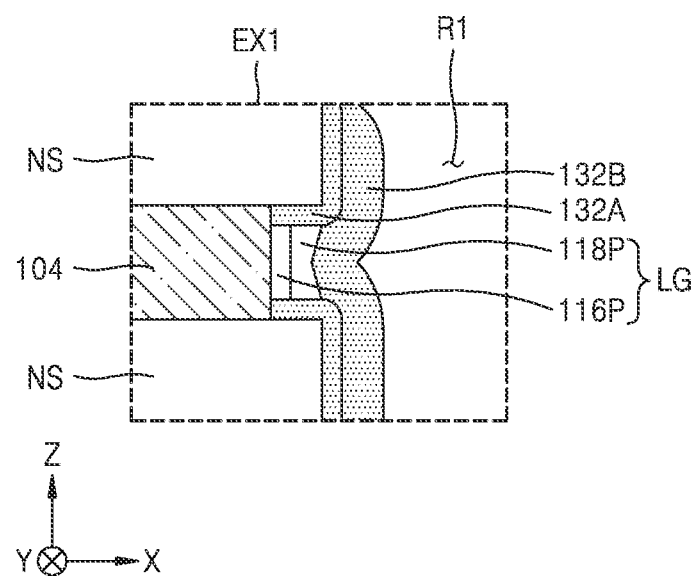
Figure 19C:
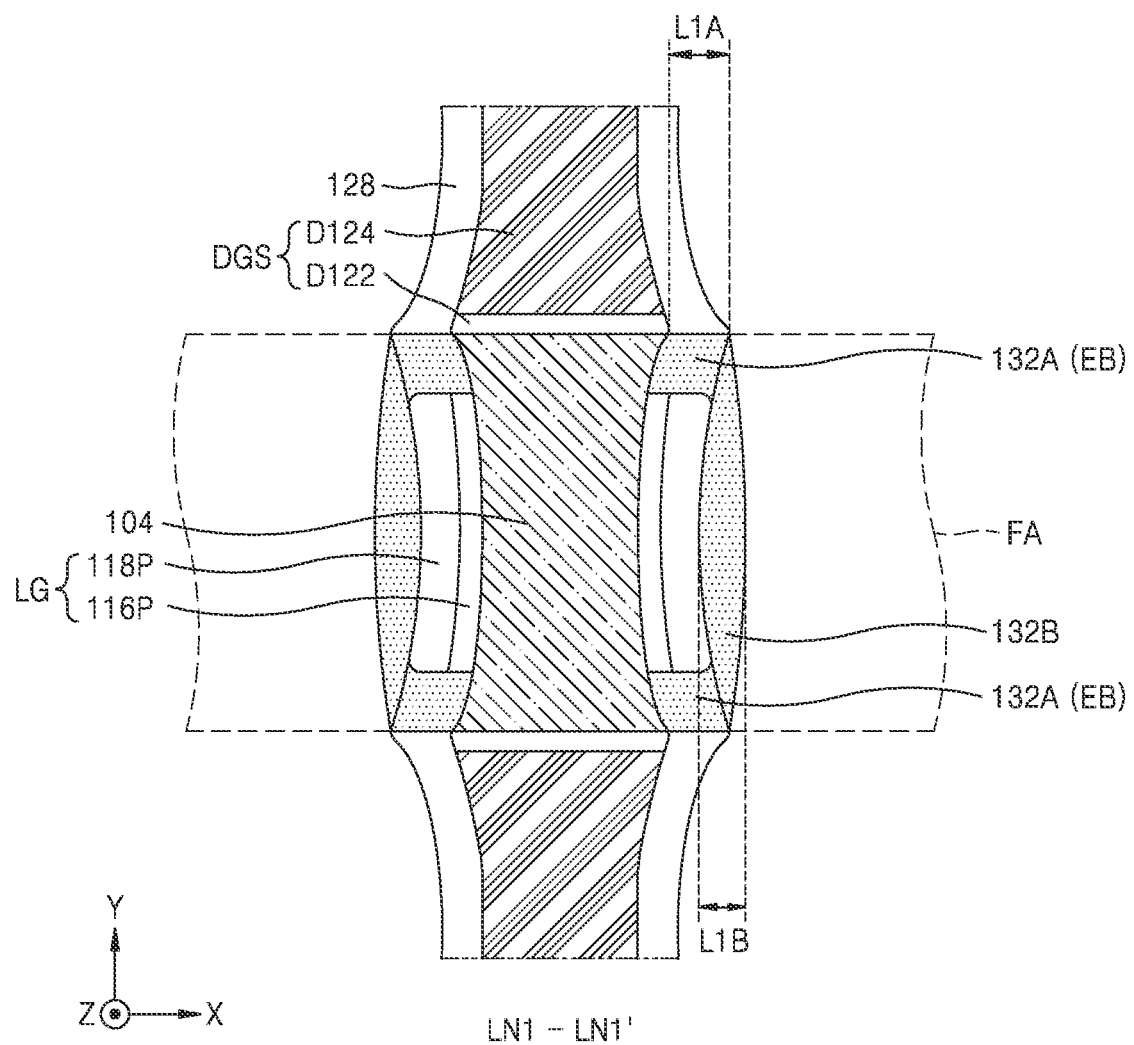

Referring to FIGS. 19A, 19B, and 19C, in the resultant structure of FIGS. 18A, 18B, and 18C, a second blocking layer 132B may be formed on the first blocking layer 132A.

In some embodiments, the second blocking layer 132B may be formed by performing substantially the same process as the process of forming the first blocking layer 132A, which has been described with reference to FIGS. 18A, 18B, and 18C. In some embodiments, after the second blocking layer 132B is formed, the first blocking layer 132A and the second blocking layer 132B may be crystallized by using an annealing process. The annealing process may be performed at a temperature of about 650° C. to about 750° C., for example, about 700° C., without being limited thereto.

Figure 20:
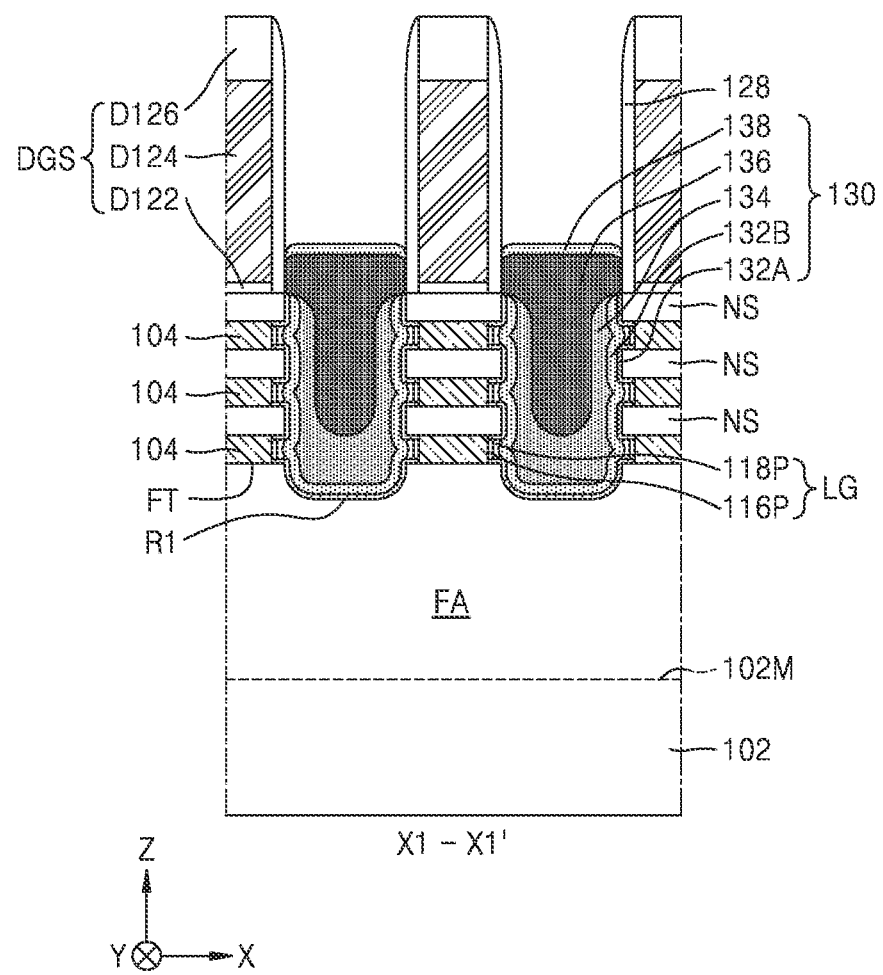

Referring to FIG. 20, in the resultant structure of FIGS. 19A, 19B, and 19C, a buffer layer 134, a main body layer 136, and a capping layer 138 may be sequentially formed on the second blocking layer 132B, which is exposed inside each of the plurality of recesses R1 in the resultant structure of FIGS. 19A, 19B, and 19C, and thus, a plurality of source/drain regions 130 may be formed. To form the buffer layer 134 and the main body layer 136, processes that are substantially similar to the process of forming the first blocking layer 132A, which has been described with reference to FIGS. 18A, 18B, and 18C, may be performed.

Figure 21:
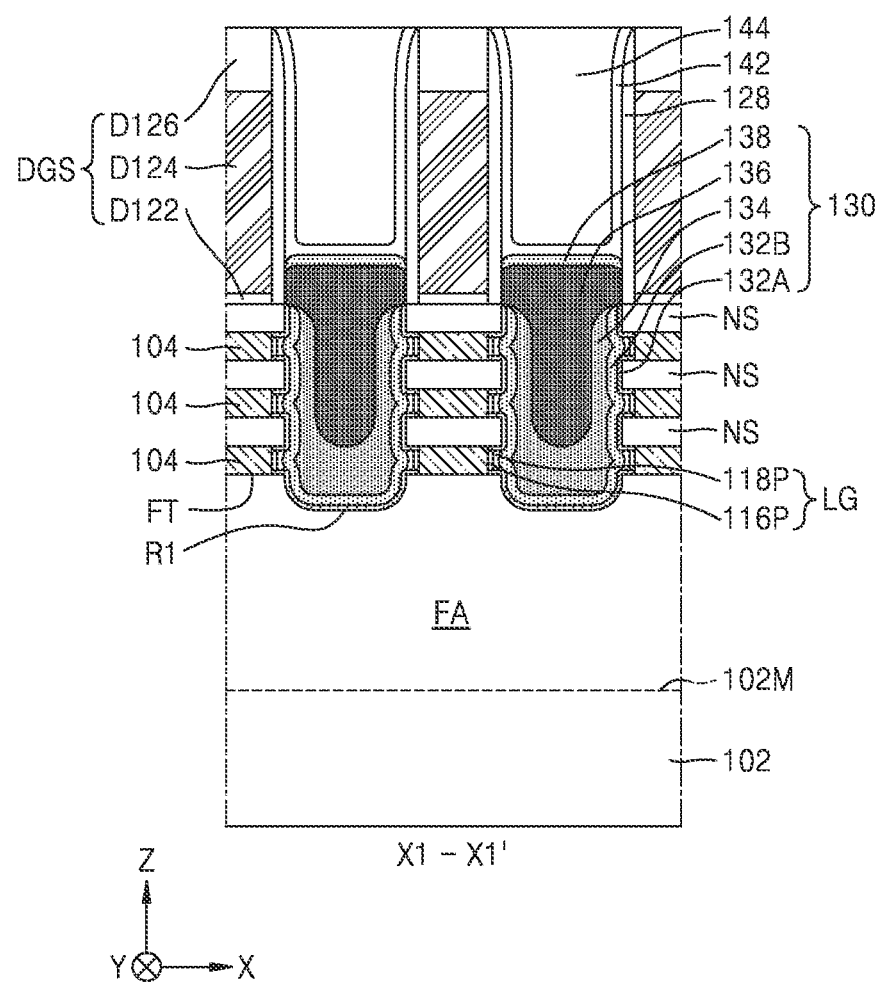

Referring to FIG. 21, an insulating liner 142 may be formed to cover the resultant structure of FIG. 20 in which the plurality of source/drain regions 130 are formed, and an inter-gate dielectric film 144 may be formed on the insulating liner 142. Thereafter, the insulating liner 142 and the inter-gate dielectric film 144 may be planarized to expose a top surface of the capping layer D126.

Figure 22:
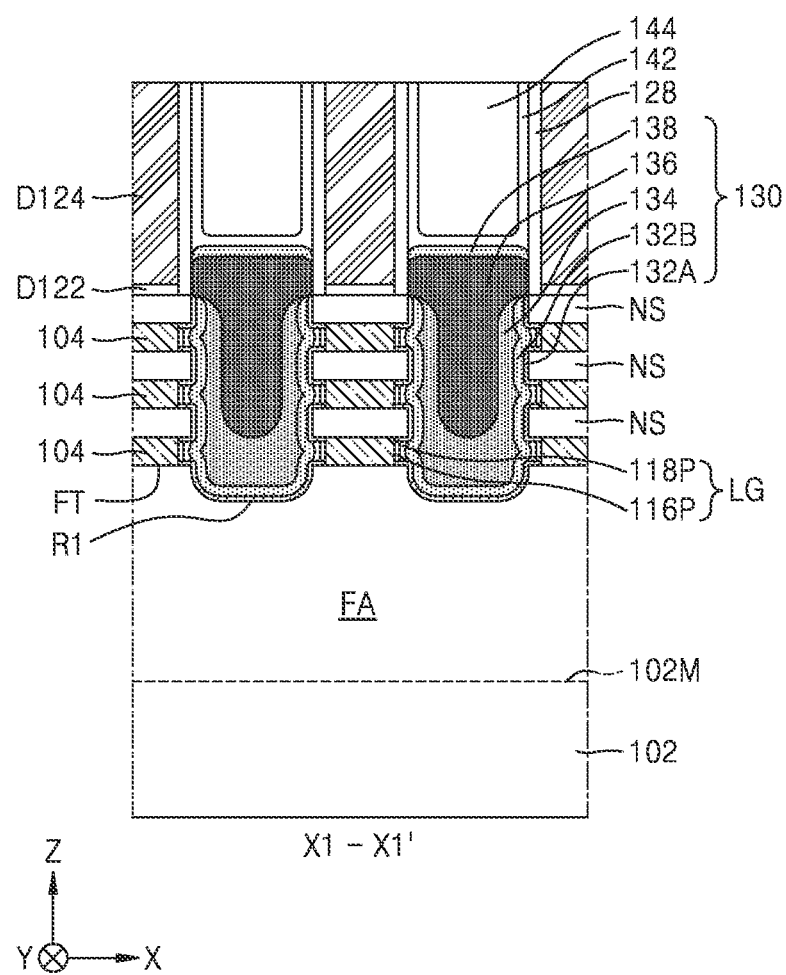

Referring to FIG. 22, the capping layer D126 may be removed from the resultant structure of FIG. 21 to expose a top surface of the dummy gate layer D124. The insulating liner 142 and the inter-gate dielectric film 144 may be partially removed such that a top surface of the inter-gate dielectric film 144 is at substantially the same level as the top surface of the dummy gate layer D124.

Figure 23:
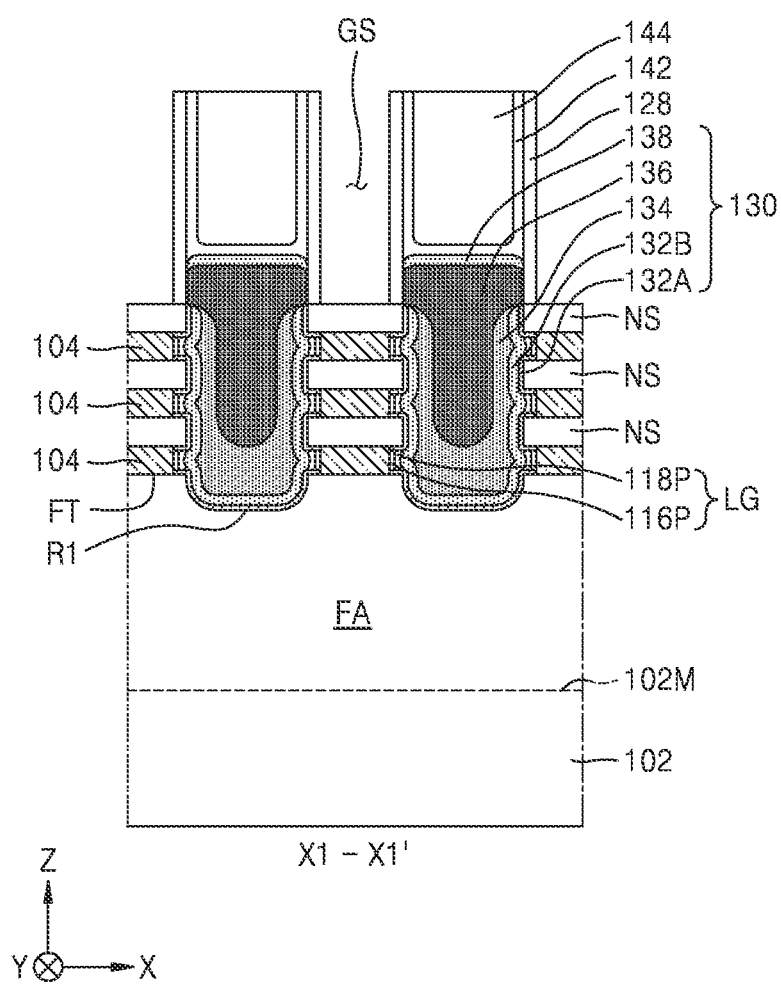

Referring to FIG. 23, the dummy gate layer D124 and the oxide film D122 located thereunder may be removed from the resultant structure of FIG. 22 to prepare a gate space GS, and the plurality of nanosheet stacks NSS may be exposed through the gate space GS.

Figure 24:
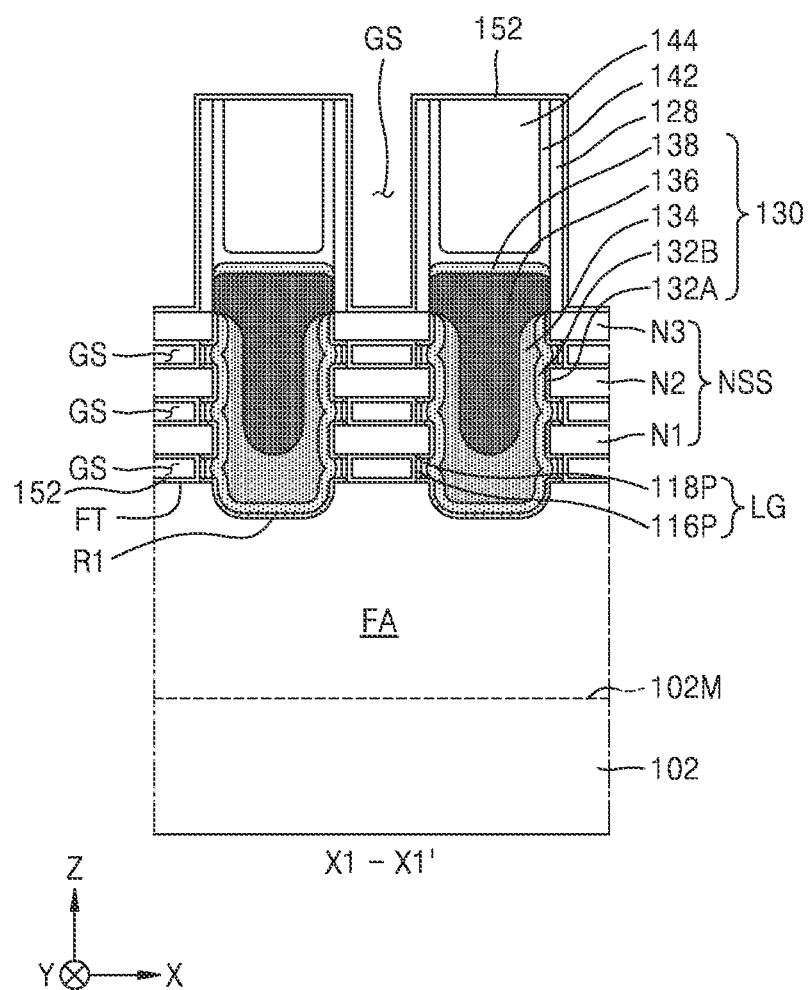

Referring to FIG. 24, in the resultant structure of FIG. 23, the plurality of sacrificial semiconductor layers 104 remaining on the fin-type active region FA may be removed through the gate space GS. Thus, the gate space GS may extend to respective spaces between the first nanosheet N1, the second nanosheet N2, and the third nanosheet N3 and a space between the first nanosheet N1 and the fin top surface FT of the fin-type active region FA.

In some embodiments, to selectively remove the plurality of sacrificial semiconductor layers 104, etch selectivities of the first to third nanosheets N1, N2, and N3 with respect to the plurality of sacrificial semiconductor layers 104 may be used. An example process of selectively removing the plurality of sacrificial semiconductor layers 104 may be substantially the same as that described with reference to FIGS. 14A and 14B.

Thereafter, a gate dielectric film 152 may be formed to cover respective exposed surfaces of the first to third nanosheets N1, N2, and N3 and the fin-type active region FA. The gate dielectric film 152 may be formed using an atomic layer deposition (ALD) process.

Figure 25:
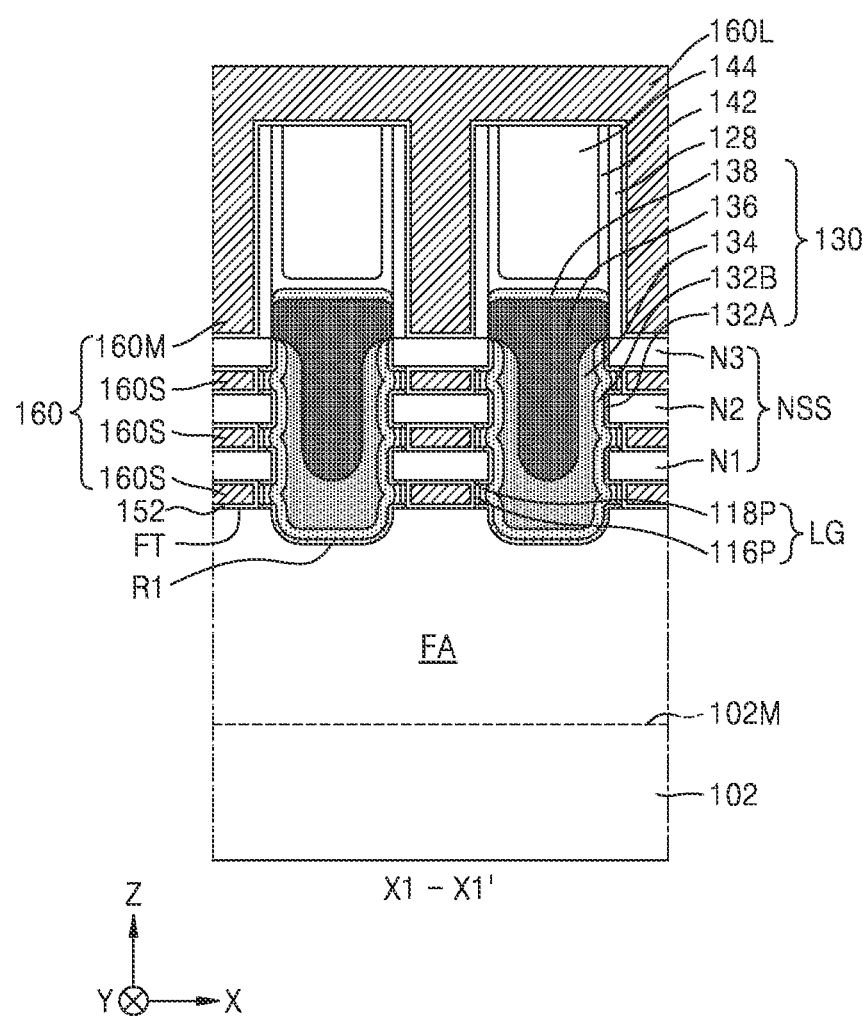

Referring to FIG. 25, on the resultant structure of FIG. 24, a gate-forming conductive layer 160L filling the gate space (see GS in FIG. 24) and covering the top surface of the inter-gate dielectric film 144 may be formed on the gate dielectric film 152. The gate-forming conductive layer 160L may include a metal, a metal nitride, a metal carbide, or a combination thereof. The gate-forming conductive layer 160L may be formed using an ALD process or a CVD process.

Figure 26:
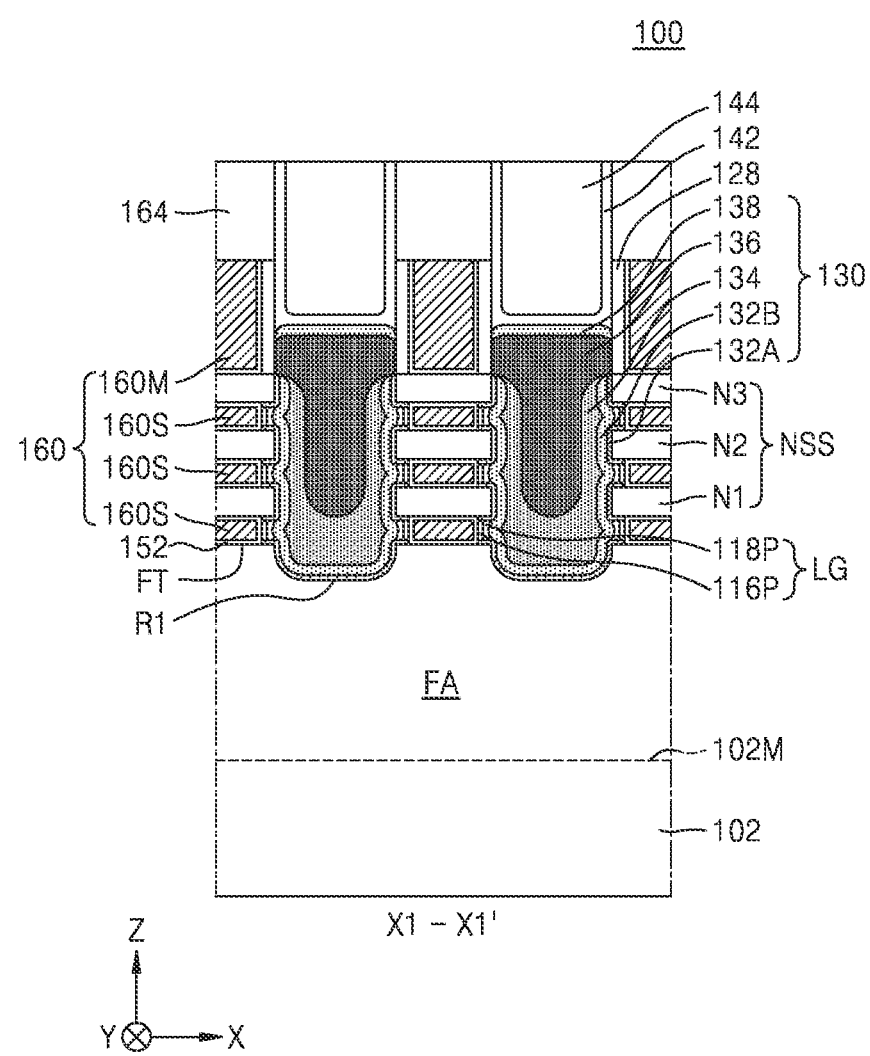

Referring to FIG. 26, in the resultant structure of FIG. 25, the gate-forming conductive layer 160L and the gate dielectric film 152 may be partially removed from top surfaces thereof to expose the top surface of the inter-gate dielectric film 144 and empty an upper portion of the gate space GS again. Thus, a gate line 160 may be formed. In this case, an upper portion of each of the plurality of outer insulating spacers 128 may also be consumed, and thus, a height of each of the plurality of outer insulating spacers 128 may be reduced. Thereafter, a capping insulating pattern 164 filling the gate space GS may be formed on the gate line 160.

Figure 27A:
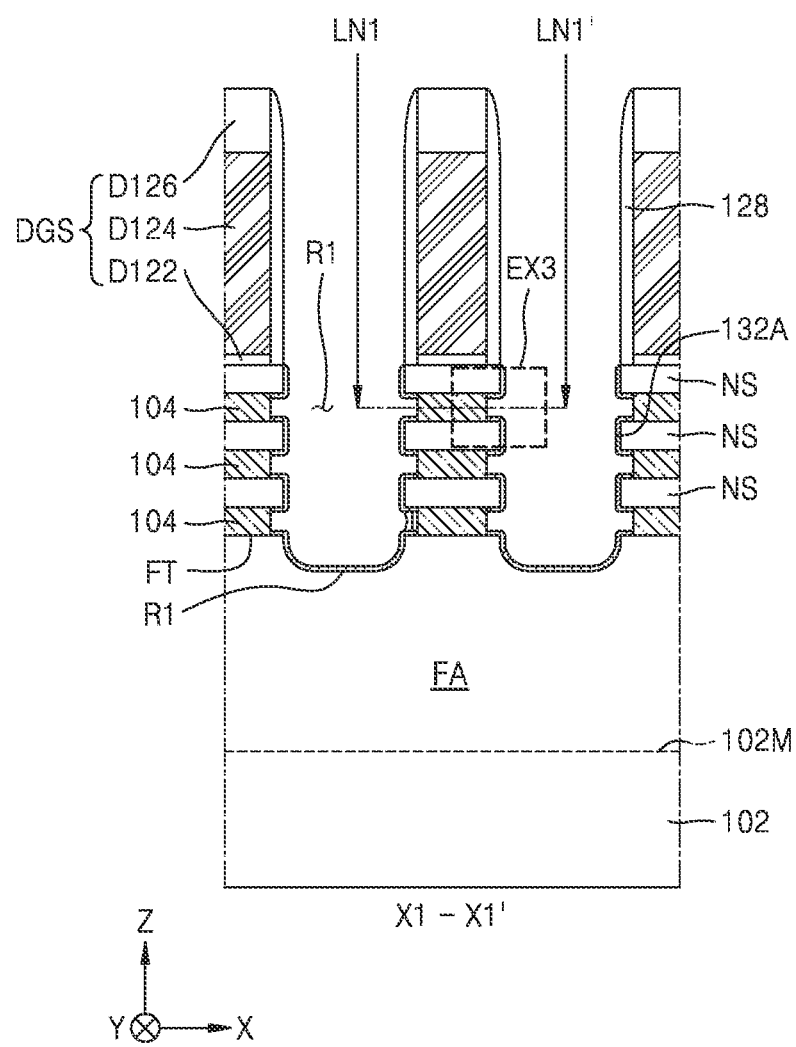
Figure 27B:
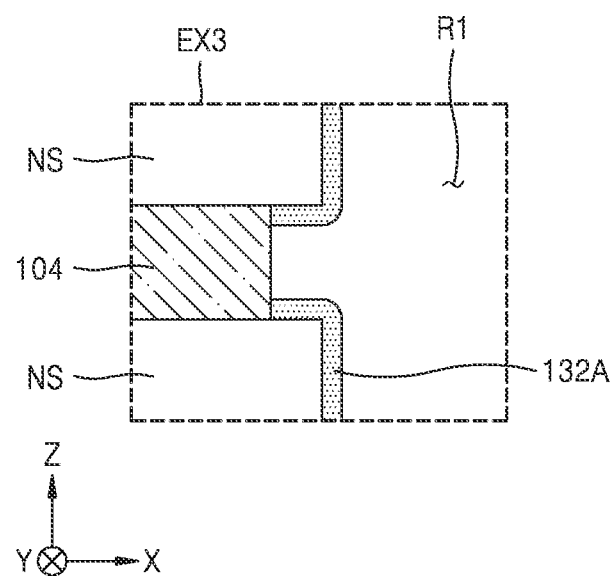
FIGS. 27B and 28B are enlarged cross-sectional views of a local region "EX3" of FIGS. 27A and 28A, and FIGS. 27C and 28C are enlarged plan views of some components at a vertical level corresponding to the cross-section taken along line LN1-LN1' of FIGS. 27A and 28A.
Figure 27C:
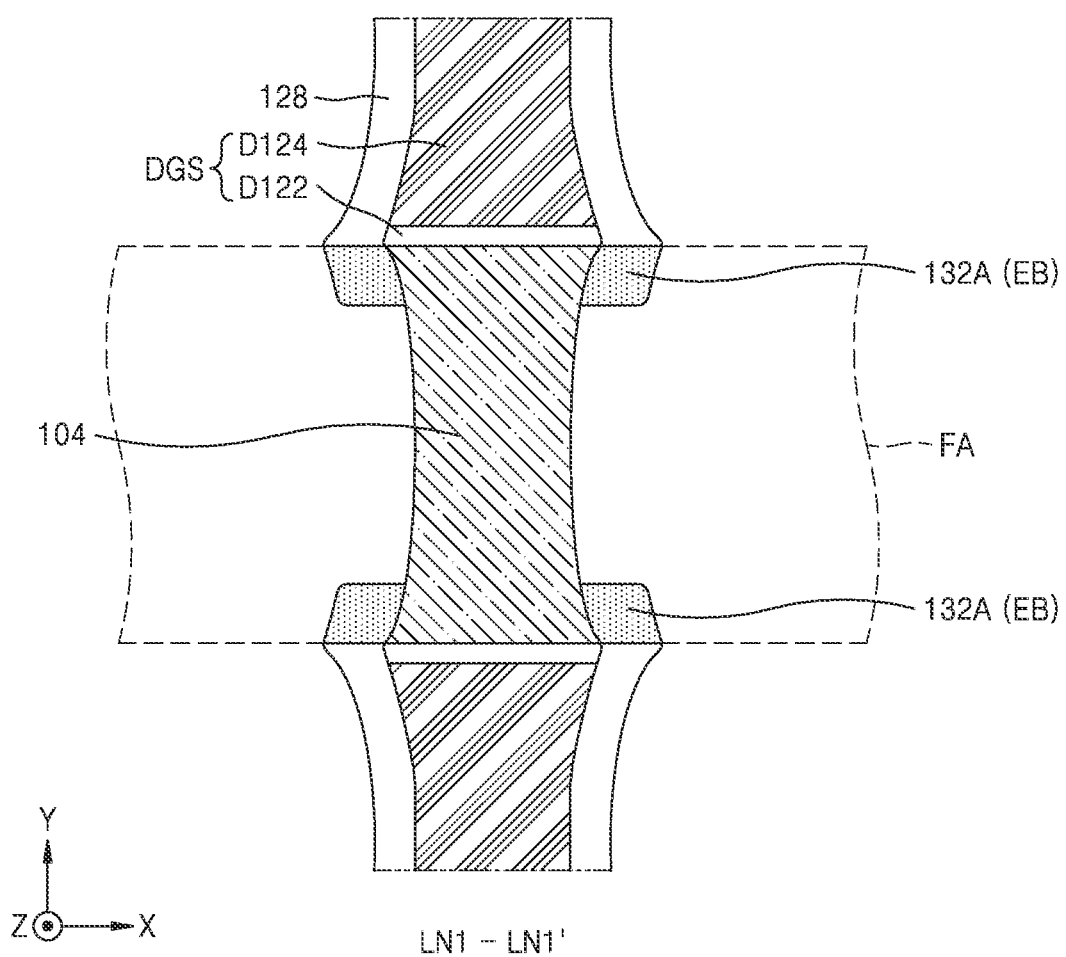
Figure 28A:
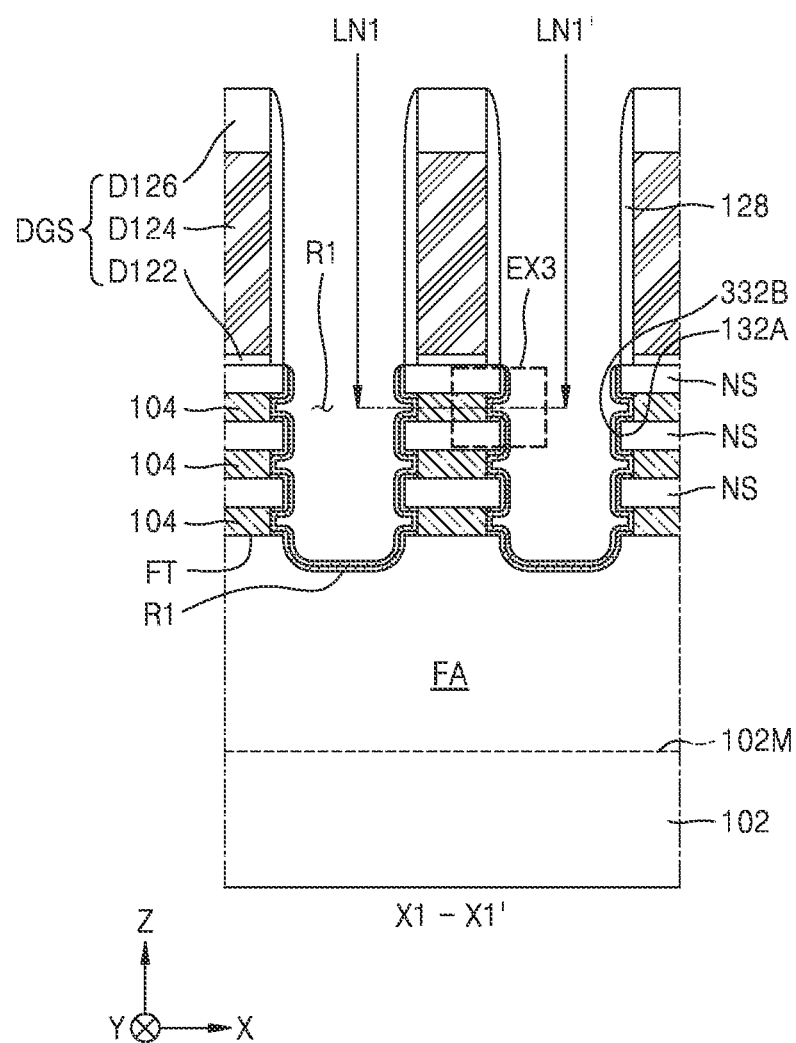
Figure 28B:
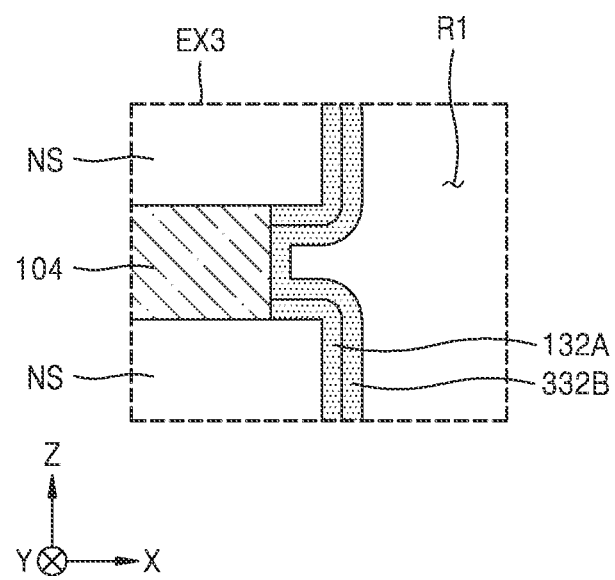

FIGS. 27A to 28C are diagrams of a process sequence of a method of manufacturing an IC device, according to some embodiments, wherein FIGS. 27A and 28A are cross-sectional views of a portion corresponding to the cross-section taken along line X1-X1' of FIG. 1, according to a process sequence, FIGS. 27B and 28B are enlarged cross-sectional views of a local region "EX3" of FIGS. 27A and 28A, and FIGS. 27C and 28C are enlarged plan views of some components at a vertical level corresponding to the cross-section taken along line LN1-LN1' of FIGS. 27A and 28A. A method of manufacturing the IC device 300 shown in FIGS. 6A to 6C will now be described with reference to FIGS. 27A to 28C. In FIGS. 27A to 28C, the same reference numerals are used to denote the same elements as in FIGS. 2A to 2E, 4A, and 4B, and detailed descriptions thereof are omitted for conciseness.

Referring to FIGS. 27A, 27B, and 27C, the processes performed up to forming a first blocking layer 132A inside a plurality of recesses R1 may be performed by using the same method as that described with reference to FIGS. 11 to 18C and thus a repeated description thereof is omitted for conciseness. Thereafter, a plurality of local insulating guides LG may be selectively removed from the resultant structure of FIGS. 18A, 18B, and 18C, and thus, a sacrificial semiconductor layer 104 may be exposed in each of a plurality of indent regions IND.

Figure 28C:
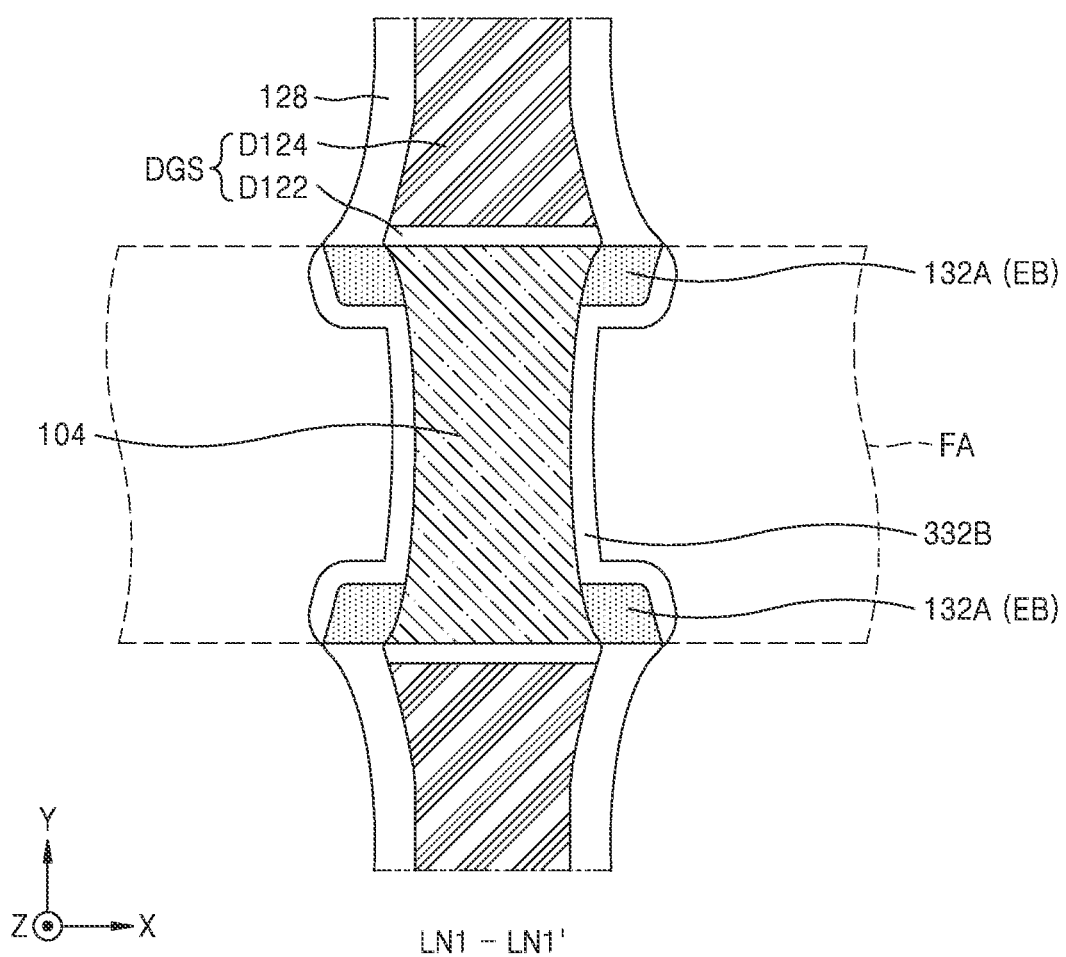

Referring to FIGS. 28A, 28B, and 28C, a second blocking layer 332B may be formed to cover the first blocking layer 132A and the sacrificial semiconductor layer 104, which are exposed in the resultant structure of FIGS. 27A, 27B, and 27C. The second blocking layer 332B may be formed by using substantially the same process as that described with reference to FIGS. 19A, 19B, and 19C and thus a repeated description thereof is omitted for conciseness.

Thereafter, the processes described with reference to FIGS. 20 to 26 may be performed, and thus, the IC device 300 shown in FIGS. 6A to 6C may be manufactured.

To manufacture the IC device 200 shown in FIGS. 4A and 4B, the method described with reference to FIGS. 11 to 26 may be used. However, in some embodiments, a plurality of sacrificial semiconductor layers 104 may be removed by using the method described with reference to FIG. 24 and before a gate dielectric film 152 is formed, a first insulating pattern 116P may be removed through a gate space GS to expose a second insulating pattern 118P. Thereafter, a gate dielectric film 153 may be formed to contact the second insulating pattern 118P. Afterwards, processes similar to those described with reference to FIGS. 25 and 26 may be performed, and thus, the IC device 200 shown in FIGS. 4A and 4B may be manufactured.

Although the methods of manufacturing the IC device 100 shown in FIGS. 1 and 2A to 2D, the IC device 200 shown in FIGS. 4A and 4B, and the IC device 300 shown in FIGS. 6A to 6C, according to some embodiments, have been described with reference to FIGS. 11 to 28C, it will be understood that the IC devices 100A, 200A, 300A, 400, and 400A shown in FIGS. 3, 5, and 7 to 9 and IC devices having various other structures may be manufactured by making various modifications and changes within the scope of the present disclosure.

While various embodiments been particularly shown and described with reference to the drawings, it will be understood that various changes in form and details may be made therein without departing from the spirit and scope of the following claims.

What is claimed is:
1. An integrated circuit device comprising:
a fin-type active region extending long in a first lateral direction on a substrate;
a pair of nanosheets on the fin-type active region, the pair of nanosheets overlapping each other in a vertical direction;
a gate line surrounding the pair of nanosheets on the fin-type active region, the gate line comprising a sub-gate portion between the pair of nanosheets;
a source/drain region adjacent to the gate line on the fin-type active region, the source/drain region being in contact with the pair of nanosheets; and a gate dielectric film between the gate line and the pair of nanosheets and between the gate line and the source/drain region, wherein the source/drain region comprises:

a first blocking layer between the pair of nanosheets, the first blocking layer comprising an edge barrier enhancing portion facing the sub-gate portion with the gate dielectric film therebetween and a portion that intermittently extends in the vertical direction; and a second blocking layer comprising a portion that is apart from the sub-gate portion with the first blocking layer therebetween, wherein the edge barrier enhancing portion is in contact with the gate dielectric film in a region vertically between the pair of nanosheets.

2. The integrated circuit device of claim 1, wherein, in a plan view that is parallel to a surface of the substrate, a maximum width of the edge barrier enhancing portion in the first lateral direction is greater than a maximum width of the second blocking layer in the first lateral direction.

3. The integrated circuit device of claim 1, wherein, in a plan view that is parallel to a surface of the substrate, the edge barrier enhancing portion protrudes more toward the sub-gate portion in the first lateral direction than other portions of the source/drain region.

4. The integrated circuit device of claim 1, further comprising an outer insulating spacer covering a sidewall of the gate line, wherein the edge barrier enhancing portion fills a corner region and is in contact with each of the gate dielectric film and the outer insulating spacer in the corner region, the corner region being defined by an intersection of a portion of the gate dielectric film covering a sidewall of the sub-gate portion and the outer insulating spacer.

5. The integrated circuit device of claim 1, further comprising a local insulating guide between the pair of nanosheets, the local insulating guide being in contact with the edge barrier enhancing portion, wherein the local insulating guide is in contact with the gate dielectric film in a region vertically between the pair of nanosheets, and the second blocking layer comprises a portion that is apart from the gate dielectric film with the local insulating guide therebetween between the pair of nanosheets.

6. The integrated circuit device of claim 1, further comprising a local insulating guide between the pair of nanosheets, the local insulating guide being in contact with the edge barrier enhancing portion, wherein the local insulating guide comprises a first insulating pattern and a second insulating pattern between the pair of nanosheets, the first insulating pattern and the second insulating pattern being sequentially stacked on the gate dielectric film in the first lateral direction, and the first insulating pattern and the second insulating pattern comprise different materials from each other.

7. The integrated circuit device of claim 1, further comprising a local insulating guide between the pair of nanosheets, the local insulating guide being in contact with the edge barrier enhancing portion, wherein, a portion of the gate dielectric film that is in contact with the local insulating guide in a region vertically between the pair of nanosheets is closer to a center of the source/drain region than a portion of the gate dielectric film that is in contact with the first blocking layer.

8. The integrated circuit device of claim 1, wherein each of the first blocking layer and the second blocking layer comprises a $Si_{1-x}Ge_x$ layer (here, $x \neq 0$), and a first Ge content of the first blocking layer is equal to a second Ge content of the second blocking layer.

9. The integrated circuit device of claim 1, wherein each of the first blocking layer and the second blocking layer comprises a $Si_{1-x}Ge_x$ layer (here, $x \neq 0$), and a first Ge content of the first blocking layer is lower than a second Ge content of the second blocking layer.

10. The integrated circuit device of claim 1, wherein the source/drain region comprises a buffer layer and a main body layer, the buffer layer having a sidewall and a bottom surface in contact with the second blocking layer, the main body layer having a sidewall and a bottom surface in contact with the buffer layer, each of the first blocking layer, the second blocking layer, the buffer layer, and the main body layer comprises a $Si_{1-x}Ge_x$ layer (here, $x \neq 0$) doped with a p-type dopant, and each of the buffer layer and the main body layer has a higher Ge content than each of the first blocking layer and the second blocking layer, and the main body layer has a higher Ge content than the buffer layer.

11. The integrated circuit device of claim 1, wherein the first blocking layer comprises a portion overlapping the pair of nanosheets in the vertical direction.

12. The integrated circuit device of claim 1, wherein, in the source/drain region, each of the first blocking layer and the second blocking layer comprises a portion in contact with the gate dielectric film in a region vertically between the pair of nanosheets.

13. An integrated circuit device comprising:

a fin-type active region extending long in a first lateral direction on a substrate;

a plurality of nanosheets facing a fin top surface of the fin-type active region at a position apart from the fin top surface of the fin-type active region, the plurality of nanosheets being at different vertical distances from the fin top surface of the fin-type active region;

a gate line surrounding each of the plurality of nanosheets on the fin-type active region, the gate line comprising a sub-gate portion between a pair of adjacent nanosheets of the plurality of nanosheets, the gate line extending long in a second lateral direction, wherein the second lateral direction intersects with the first lateral direction;

an outer insulating spacer covering a sidewall of the gate line; and a source/drain region facing the plurality of nanosheets in the first lateral direction, wherein the source/drain region comprises:

a first blocking layer comprising portions respectively in contact with the plurality of nanosheets and a portion in contact with the fin-type active region, the first blocking layer comprising an edge barrier enhancing portion having, in plan view, a greater width in the first lateral direction at a position adjacent to the outer insulating spacer than other portions of the first blocking layer, the edge barrier enhancing portion facing the sub-gate portion between the pair of adjacent nanosheets; and a second blocking layer comprising a portion that is apart from the sub-gate portion with the first blocking layer therebetween, wherein the first blocking layer comprises a portion that intermittently extends in a vertical direction.

14. The integrated circuit device of claim 13, wherein, in a plan view that is parallel to a main surface of the substrate, a maximum width of the edge barrier enhancing portion in the first lateral direction is greater than a maximum width of the second blocking layer.

15. The integrated circuit device of claim 13, further comprising:
- a local insulating guide between the pair of adjacent nanosheets, the local insulating guide comprising a portion in contact with the first blocking layer and a portion in contact with the second blocking layer; and
- a gate dielectric film between the pair of adjacent nanosheets, the gate dielectric film being between the sub-gate portion and the local insulating guide and between the sub-gate portion and the edge barrier enhancing portion, wherein each of the first blocking layer and the local insulating guide is in contact with the gate dielectric film, and the second blocking layer is apart from the gate dielectric film with the local insulating guide therebetween.

16. The integrated circuit device of claim 13, further comprising a gate dielectric film between the pair of adjacent nanosheets, the gate dielectric film being between the sub-gate portion and the first blocking layer and between the sub-gate portion and the second blocking layer, wherein each of the first blocking layer and the second blocking layer is in contact with the gate dielectric film.

17. An integrated circuit device comprising:
- a fin-type active region extending long in a first lateral direction on a substrate;
- a pair of nanosheet stacks facing a fin top surface of the fin-type active region in a vertical direction at a position apart from the fin top surface of the fin-type active region, each nanosheet stack comprising a plurality of nanosheets at different vertical distances from the fin top surface of the fin-type active region;
- a pair of gate lines respectively on the pair of nanosheet stacks on the fin-type active region, each gate line comprising a sub-gate portion between a pair of adjacent nanosheets;
- a plurality of outer insulating spacers covering sidewalls of each of the pair of gate lines; and
- a source/drain region on the fin-type active region between the pair of nanosheet stacks, the source/drain region being in contact with each of the pair of nanosheet stacks and comprising a $Si_{1-x}Ge_x$ layer (here, x≠0) doped with boron, wherein the source/drain region comprises:
- a first blocking layer in contact with the plurality of nanosheets of each of the pair of nanosheet stacks, the first blocking layer comprising an edge barrier enhancing portion having, in plan view, a greater width in the first lateral direction at a position adjacent to the plurality of outer insulating spacers than other portions of the first blocking layer, the edge barrier enhancing portion facing the sub-gate portion between the pair of adjacent nanosheets; and
- a second blocking layer comprising a portion that is apart from the sub-gate portion with the first blocking layer therebetween, wherein the first blocking layer comprises a portion that intermittently extends in the vertical direction.

18. The integrated circuit device of claim 17, wherein, in the source/drain region, the first blocking layer comprises four edge barrier enhancing portions spaced apart from each other.

19. The integrated circuit device of claim 17, further comprising:
- a pair of gate dielectric films covering sidewalls of the sub-gate portion of each of the pair of gate lines; and
- a local insulating guide between the pair of adjacent nanosheets, the local insulating guide comprising a portion in contact with the pair of gate dielectric films, wherein the local insulating guide comprises a silicon oxide film, a silicon nitride film, or a combination thereof.

* * * * *